(12) United States Patent
Fujiwara et al.

(10) Patent No.: US 9,500,683 B2
(45) Date of Patent: Nov. 22, 2016

(54) ARBITRATION DEVICE, ARBITRATION METHOD, AND COMPUTER PROGRAM PRODUCT

(71) Applicants: Yukio Fujiwara, Kanagawa (JP); Kenji Kameyama, Kanagawa (JP); Hidenori Tomono, Kanagawa (JP); Takeo Tsukamoto, Kanagawa (JP); Fumio Yoshizawa, Kanagawa (JP); Keisuke Konishi, Kanagawa (JP); Takanori Inadome, Kanagawa (JP); Hideaki Aratani, Kanagawa (JP); Juuta Kon, Tokyo (JP); Hirotaka Nitta, Tokyo (JP); Toshiki Suzuki, Tokyo (JP)

(72) Inventors: Yukio Fujiwara, Kanagawa (JP); Kenji Kameyama, Kanagawa (JP); Hidenori Tomono, Kanagawa (JP); Takeo Tsukamoto, Kanagawa (JP); Fumio Yoshizawa, Kanagawa (JP); Keisuke Konishi, Kanagawa (JP); Takanori Inadome, Kanagawa (JP); Hideaki Aratani, Kanagawa (JP); Juuta Kon, Tokyo (JP); Hirotaka Nitta, Tokyo (JP); Toshiki Suzuki, Tokyo (JP)

(73) Assignee: RICOH COMPANY, LTD., Tokyo (JP)

(*) Notice: Subject to any disclaimer, the term of this patent is extended or adjusted under 35 U.S.C. 154(b) by 128 days.

(21) Appl. No.: 14/196,153

(22) Filed: Mar. 4, 2014

(65) Prior Publication Data

US 2014/0266153 A1    Sep. 18, 2014

(30) Foreign Application Priority Data

Mar. 14, 2013 (JP) ................. 2013-052539
Dec. 13, 2013 (JP) ................. 2013-258367

(51) Int. Cl.
  *G01R 21/00* (2006.01)
  *G06F 1/32* (2006.01)
  *G06F 3/01* (2006.01)
  *H02J 1/14* (2006.01)

(52) U.S. Cl.
  CPC .............. *G01R 21/00* (2013.01); *G06F 1/325* (2013.01); *G06F 1/3231* (2013.01); *G06F 1/3287* (2013.01); *G06F 3/011* (2013.01); *H02J 1/14* (2013.01); *Y02B 60/1282* (2013.01); *Y02B 60/1289* (2013.01)

(58) Field of Classification Search
  CPC ...................................................... G01R 21/00
  See application file for complete search history.

(56) References Cited

U.S. PATENT DOCUMENTS

2005/0071698 A1    3/2005 Kangas
2008/0091284 A1    4/2008 Sugiyama et al.
(Continued)

FOREIGN PATENT DOCUMENTS

CN    202034821 U    11/2011
EP    2 521 244 A1    11/2012
(Continued)

OTHER PUBLICATIONS

The Extended European Search Report issued Oct. 10, 2014, in Application No. / Patent No. 14156713.1-1953/2778835.
(Continued)

*Primary Examiner* — Jermele M Hollington
(74) *Attorney, Agent, or Firm* — Oblon, McClelland, Maier & Neustadt, L.L.P.

(57) ABSTRACT

An arbitration device comprises a determining unit that determines priority of each of a plurality of electrical devices according to at least either a position or an action status of a person present in a target area for control; and a calculating unit that calculates electrical power to be allotted to each of the electrical devices in such a way that a total of electrical power allotted to a plurality of the electrical devices is within a limit value and the electrical devices having the priority at high levels are allotted with electrical power on a priority basis.

6 Claims, 18 Drawing Sheets

(56) References Cited

U.S. PATENT DOCUMENTS

2012/0296485 A1* 11/2012 Kambara ............... H02J 3/14 700/295
2015/0177711 A1 6/2015 Yuzurihara et al.

FOREIGN PATENT DOCUMENTS

| JP | 2004-360925 | 12/2004 |
|----|-------------|---------|
| JP | 2005-025472 | 1/2005 |
| JP | 2010-193562 | 9/2010 |
| JP | 2012-195988 | 10/2012 |
| JP | 2014-41814 A | 3/2014 |

OTHER PUBLICATIONS

Kenji Yuasa et al. "Energy on Demand over SmartTap Network", Technical Report of IEICE., USN Nov. 2011, Jul. 2011, 6 pages.
Combined Chinese Office Action and Search Report issued Oct. 10, 2015 in Patent Application No. 201410190505.9 (with English language translation).
Kento Tamura et al. "Storage Battery Design and Charge-Discharge Management for the Energy on Demand System", Technical Report of IEICE., USN 2012, 6 pages, Jul. 2012.
The Extended European Search Report issued Oct. 10, 2014, in Application No. / U.S. Pat. No. 14156713.1-1953/2778835.

* cited by examiner

FIG.4
(a)
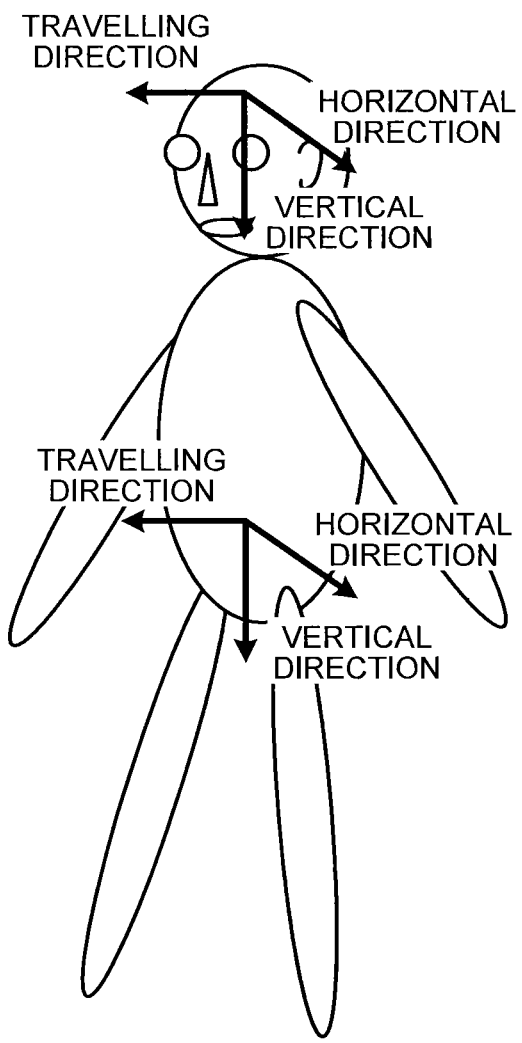
(b)
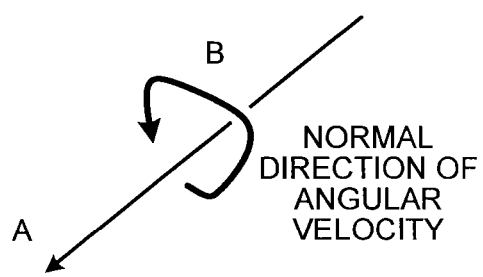

ARBITRATION DEVICE, ARBITRATION METHOD, AND COMPUTER PROGRAM PRODUCT

CROSS-REFERENCE TO RELATED APPLICATIONS

The present application claims priority to and incorporates by reference the entire contents of Japanese Patent Application No. 2013-052539 filed in Japan on Mar. 14, 2013 and Japanese Patent Application No. 2013-258367 filed in Japan on Dec. 13, 2013.

BACKGROUND OF THE INVENTION

1. Field of the Invention

The present invention relates to an arbitration device, an arbitration method, and a computer program product.

2. Description of the Related Art

For example, in offices, there are installed electrical devices such as personal computers (PCs) that are used by the users as well as devices such as air-conditioning devices and lighting devices that have an impact on the work environment. In offices, it is desirable that making the work environment more comfortable leads to achieving an enhancement in the productivity. For that reason, for example, instead of taking measures such as turning down the temperature settings of the air-conditioning devices during summertime with the aim of saving energy, sometimes it is desirable to properly maintain the preset temperature so as to make the work environment comfortable.

In Japanese Patent Application Laid-open No. 2010-193562 and in "Energy on Demand over SmartTap Network", Yuasa Kenji et al., IEICE, USN2011-11, pp. 25-30, July 2011; power control systems are disclosed that control the supply of the electrical power to electrical devices in such a way that energy saving is achieved without undermining the quality of life. For example, in "Energy on Demand over SmartTap Network", Yuasa Kenji et al., IEICE, USN2011-11, pp. 25-30, July 2011; a technology is proposed in which priority for devices is set according the characteristics of the devices and according to the time slots, and the devices having higher priority are supplied with the electrical power.

However, in such methods, the priority is set according to the functionality of stand-alone devices. Therefore, the electrical power may not be supplied to the devices which truly require it. For example, if the user of a PC moves away from keyboard while leaving the PC ON, the electrical power is continuously supplied to the PC because there is no change in the priority of the PC. In this way, sometimes the electrical power gets supplied to the devices that do not require it, thereby making it difficult to efficiently supply the electrical power to the devices that are used to make the work environment comfortable.

Besides, in an office in which a plurality of staff members is working, the behavior of each staff member is different from hour to hour. Hence, in a conventional method in which the priority is set by taking into account the time used by the devices, it is difficult to achieve an efficient electrical power supply.

In view of the abovementioned issues, there is a need to provide an arbitration device, an arbitration method, and a computer program product that enable controlling the electrical power supply to the devices in an efficient manner.

SUMMARY OF THE INVENTION

It is an object of the present invention to at least partially solve the problems in the conventional technology.

According to the present invention, there is provided an arbitration device comprising: a determining unit (802) configured to determines priority of each of a plurality of electrical devices according to at least either a position or an action status of a person present in a target area for control; and a calculating unit (803) configured to calculates electrical power to be allotted to each of the electrical devices in such a way that a total of electrical power allotted to a plurality of the electrical devices is within a limit value and the electrical devices having the priority at high levels are allotted with electrical power on a priority basis.

The present invention also provides an arbitration method comprising: determining priority of each of a plurality of electrical devices according to at least either a position or an action status of a person present in a target area for control; and calculating electrical power to be allotted to each of the electrical devices in such a way that a total of electrical power allotted to a plurality of the electrical devices is within a limit value and the electrical devices having the priority at high levels are allotted with electrical power on a priority basis.

The present invention also provides a computer program product that stores therein a computer program that causes a computer to function as: a determining unit configured to determines priority of each of a plurality of electrical devices according to at least either a position or an action status of a person present in a target area for control; and a calculating unit configured to calculates electrical power to be allotted to each of the electrical devices in such a way that a total of electrical power allotted to a plurality of the electrical devices is within a limit value and the electrical devices having the priority at high levels are allotted with electrical power on a priority basis.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a diagram illustrating the direction of detection of each sensor;

DETAILED DESCRIPTION OF THE PREFERRED EMBODIMENTS

An exemplary embodiment of an arbitration device, an arbitration method, and a computer program product according to the present invention is described in detail below with reference to the accompanying drawings.

In an arbitration device according to the present embodiment, with respect to PCs, lighting devices (lighting intensity of the lighting devices), and air-conditioning devices (temperature of the air-conditioning devices); an order of priority is set according to at least either the position or the action status (such as the posture) of a user. Then, the arbitration device allots the electrical power to each electrical device in such a way that priority is given to the electrical devices (to the operating modes of the electrical devices) having a higher order of priority and in such a way that the total amount of electrical power to be allotted to the electrical devices is within a limit value. As a result, the electrical power supply to the devices can be controlled in an efficient manner. For example, regarding a PC that was being used by a user who has moved away from keyboard, the electrical power supply to that PC can be stopped and the corresponding amount of electrical power can be supplied to the air-conditioning devices used to make the work environment more comfortable. With that, it becomes possible not only to save energy but also to achieve, for example, enhancement in the productivity in the office environment.

The following explanation is given for an example in which the arbitration device according to the present embodiment is a part of a device control system that controls the electrical power supply to the devices according to the positions of users. However, such a device control system is not the only possible system in which the arbitration device can be implemented.

Figure 1:
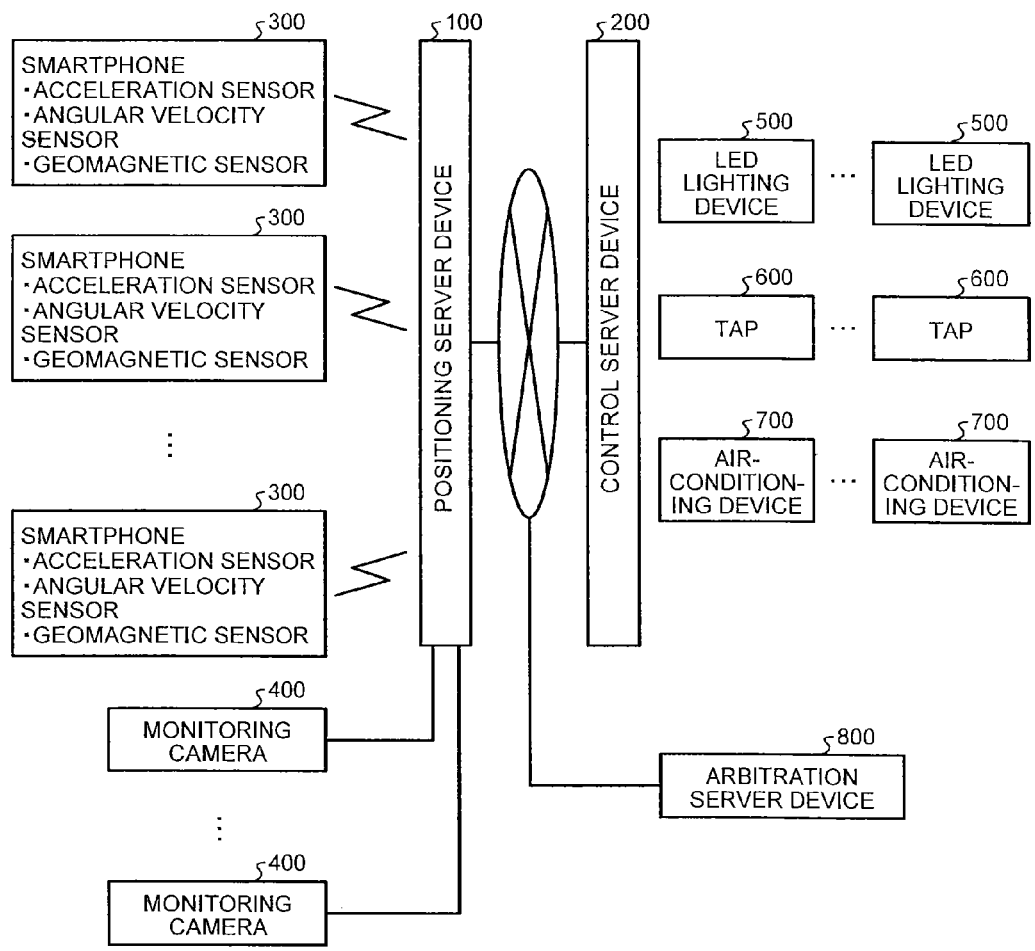
FIG. 1 is a diagram illustrating a network configuration of a device control system according to an embodiment.

FIG. 1 is a diagram illustrating a network configuration example of a device control system according to the present embodiment. As illustrated in FIG. 1, the device control system according to the present embodiment includes a plurality of smartphones 300, a plurality of monitoring cameras 400 functioning as imaging devices, a positioning server device 100, a control server device 200, a plurality of light emitting diode (LED) lighting devices 500 serving as target devices for control, a plurality of taps 600, a plurality of air-conditioning devices 700, and an arbitration server device 800 functioning as an arbitration device.

The following explanation is given for an example in which the control server device 200 and the arbitration server device 800 are implemented as separate devices. However, the configuration of devices is not limited to this example. Alternatively, for example, the configuration can be such that the functions of both devices are provided in a single server device. Thus, the functions of the positioning server device 100, the control server device 200, and the arbitration server device 800 can be arbitrarily dispersed among one or more server devices.

Meanwhile, the smartphones 300 and the monitoring cameras 400 are connected to the positioning server device 100 by, for example, a wireless communication network such as a wireless fidelity (Wi-Fi) network. However, the wireless communication system is not limited to Wi-Fi. As far as the monitoring cameras 400 are concerned, the connection with the positioning server device 100 can be a wired connection.

The positioning server device 100 and the control server device 200 are connected to each other by a network such as the Internet or a local area network (LAN).

The control server device 200 is connected to the LED lighting devices 500, the taps 600, and the air-conditioning devices 700 by, for example, a wireless communication network such as a Wi-Fi network.

However, the wireless communication system between the control server device 200, the LED lighting devices 500, the taps 600, and the air-conditioning devices 700 is not limited to Wi-Fi. Alternatively, any other wireless communication system can also be implemented. Still alternatively, it is also possible to implement a wired communication system using an Ethernet (registered trademark) cable or power line communications (PLC).

Figure 2:
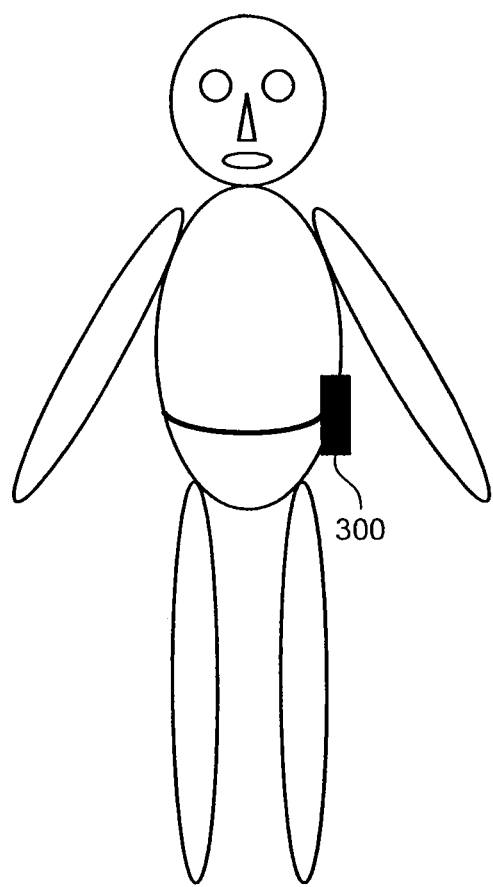
FIG. 2 is a diagram defining a state of wearing a smartphone and a sensor.

The smartphones 300 are information technology devices that are held by persons and that detect the actions of the persons. FIG. 2 is a diagram illustrating a state in which the smartphone 300 is worn. Thus, apart from being held in a hand by a person, the smartphone 300 can be worn on the waist by the person as illustrated in FIG. 2.

Returning to the explanation with reference to FIG. 1, each smartphone 300 is equipped with an acceleration sensor, an angular velocity sensor, and a geomagnetic sensor. Moreover, detection data that is obtained from each sensor at regular time intervals, such as that 1 second intervals, is sent to the positioning server device 100. Herein, the detection data of the acceleration sensor is in the form of an acceleration vector; the detection data of the angular velocity sensor is in the form of an angular velocity vector; and the detection fata of the geomagnetic sensor is in the form of a magnetic orientation vector.

In the present embodiment, each smartphone 300 is used as an information technology device for detecting the actions of a person. However, as long as an information technology device is equipped with an acceleration sensor, an angular velocity sensor, and a geomagnetic sensor, and is capable of detecting the actions of a person; it need not be a handheld device such as the smartphone 300.

Alternatively, the configuration can be such that, in addition to including an information technology devices such as an acceleration sensor, an angular velocity sensor, and a geomagnetic sensor in the smartphone 300 for detecting the actions of a person; an information technology device is worn separately from the smartphone 300 for the purpose of detecting the actions of the person.

Figure 3:
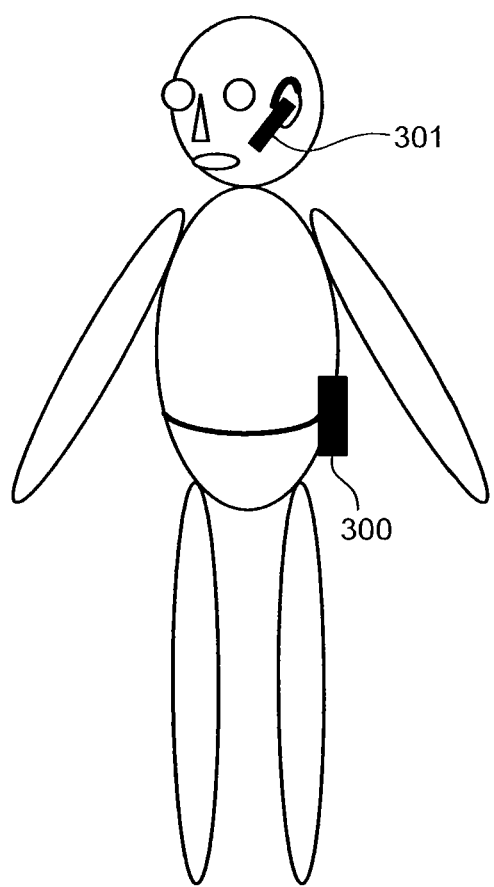
FIG. 3 is a diagram illustrating an example in which an information technology device capable of detecting the actions of a person is worn separately from a smartphone.

For example, FIG. 3 is a diagram illustrating an example in which an information technology device capable of detecting the actions of a person is worn separately from the smartphone 300. As illustrated in FIG. 3, apart from wearing the smartphone 300; a compact headset sensor group 301 that includes an acceleration sensor, an angular velocity sensor, and a geomagnetic sensor can be worn in the head region. In this case, the detection data detected by the sensor group 301 can either be sent directly to the positioning server device 100 or be sent to the positioning server device 100 via the smartphone 300. In this way, if the sensor group 301 is worn in the head region separately from the sensors of the smartphone 300, it becomes possible to detect various postures.

FIG. 4 is a diagram illustrating the direction of detection of each sensor. FIG. 4(*a*) illustrates the direction of detection of an acceleration sensor and a geomagnetic sensor. As illustrated in FIG. 4(*a*), the acceleration sensor and the geomagnetic sensor enable detection of an acceleration component and a geomagnetic orientation component, respectively, in the travelling direction, the vertical direction, and the horizontal direction. FIG. 4(*b*) illustrates an angular velocity vector A that is detected by an angular velocity sensor. Herein, an arrow B indicates the normal direction of angular velocity. In the present invention, by calling into account the projection of the angular velocity vector A onto the travelling direction, the vertical direction, and the horizontal direction illustrated in FIG. 4(*a*); the components are respectively referred to as an angular velocity component in the travelling direction, an angular velocity component in the vertical direction, and an angular velocity component in the horizontal direction.

Figure 5:
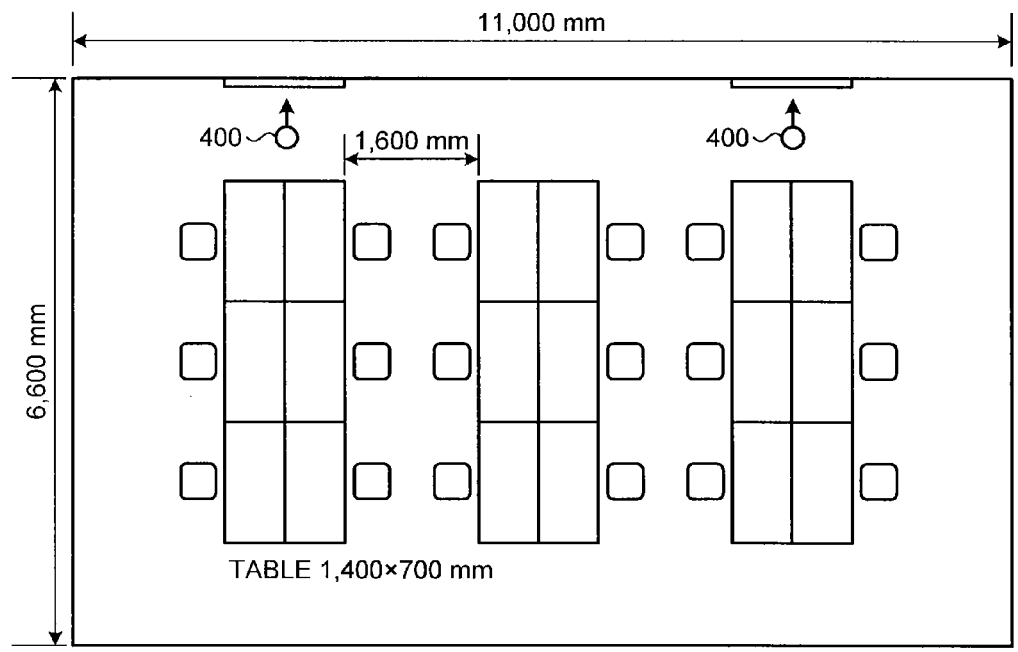
FIG. 5 is a diagram illustrating an example of the installation state of monitoring cameras.

Returning to the explanation with reference to FIG. 1, the monitoring cameras 400 take images of the room that is treated as the target area for control, and are installed near the top portion of that room. FIG. 5 is a diagram illustrating an example of the installation state of the monitoring cameras 400. In the example illustrated in FIG. 5, the monitoring cameras 400 are installed at two locations near the door of the room. However, that is not the only possible case. The monitoring cameras 400 take images of the room that is treated as the target area for control, and send the captured images (captured videos) to the positioning server device 100.

Returning to the explanation with reference to FIG. 1, in the present embodiment, a lighting system, a tap system, and an air-conditioning system are treated as targets for electrical power control. That is, a plurality of LED lighting devices 500 serving as the lighting system, a plurality of taps 600 serving as the tap system, and a plurality of air-conditioning devices 700 serving as the air-conditioning system are treated as the targets for electrical power control.

Figure 6:
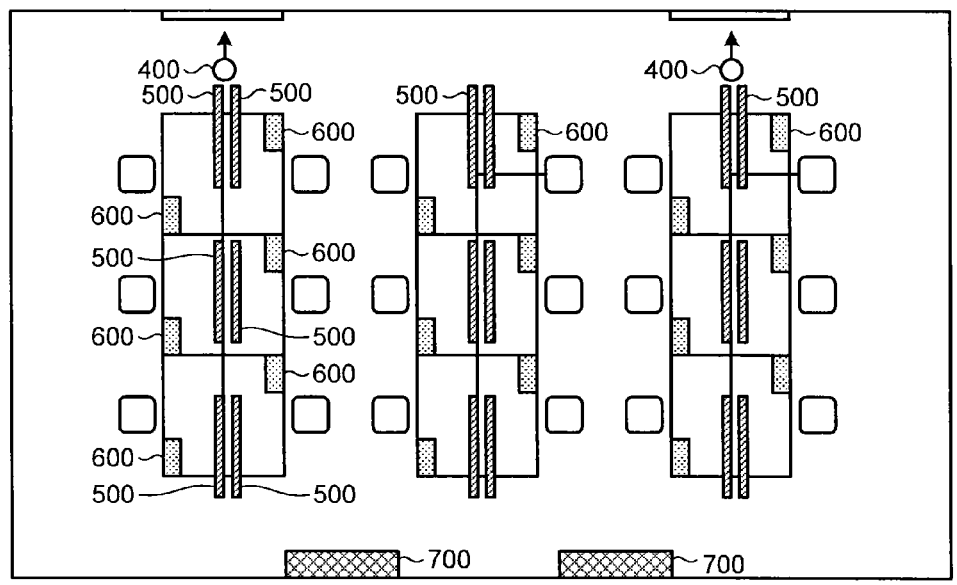
FIG. 6 is a diagram illustrating an example of the installation state of LED lighting devices, taps, and air-conditioning devices.

Herein, the LED lighting devices 500, the taps 600, and the air-conditioning devices 700 are installed in a room that is treated as the target area for control. FIG. 6 is a diagram illustrating an example of the installation state of the LED lighting devices 500, the taps 600, and the air-conditioning devices 700.

As illustrated in FIG. 6, in the room, three groups of tables are present each of which includes six tables. For each table, a single LED lighting device 500 and a single tap 600 are installed. Regarding the air-conditioning devices 700, a single unit is installed between two groups of tables. Meanwhile, this installation of the LED lighting devices 500, the taps 600, and the air-conditioning devices 700 is only exemplary, and is not limited to the example illustrated in FIG. 6.

Meanwhile, although not illustrated in FIG. 6, a system electrical-power measurement device is installed outside the room so that it becomes possible to know the information about the sum total of electrical power in the room according to the present embodiment.

Inside the room, it is assumed that 18 users are performing specific business activities, and two doors are available for entering and exiting the room. Thus, the present embodiment is confined to the layout, the types of devices, and the number of users explained above. However, the present embodiment can also be applied to various other layouts and various other types of devices. Moreover, regarding the arbitrariness in scalability in the spatial scale and the number of users, and regarding the arbitrariness in user attributes and the variation in the concerned types of business activities at an individual level or a group level; the present embodiment can be applied in a widely expanding manner. Besides, the present embodiment is not limited to the indoor space as illustrated in FIGS. 5 and 6, and can be applied in an outdoor space too.

Herein, the positioning server device 100, the control server device 200, and the arbitration server device 800 according to the present embodiment are installed outside the room illustrated in FIGS. 5 and 6. However, alternatively, the positioning server device 100, the control server device 200, and the arbitration server device 800 can be installed inside the room that is treated as the target area for control, and can be treated as the targets for electrical power control.

Moreover, in the present embodiment, regarding various types of network devices such as Wi-Fi access points, switching hubs, or routers which constitute a communication network system; they are not treated as the targets for electrical power control. However, it is also possible to treat such network devices as the targets for electrical power control.

The electrical energy consumed by the network devices can be calculated by subtracting the sum total of electrical power in the LED lighting devices 500, the air-conditioning devices 700, and the taps 600 from the sum total of system electrical power mentioned above.

Each of the LED lighting devices 500, the taps 600, and the air-conditioning devices 700 are remote-controlled by the control server device 200 via a network.

That is, regarding each LED lighting device 500, the lighting range and the lighting intensity is remote-controlled by the control server device 200. More particularly, each LED lighting device 500 is equipped with an ON/OFF switch that is individually remote-controllable; and ON/OFF control is performed by the control server device 200 using a wireless communication system such as Wi-Fi. In the LED lighting devices 500, LED lights having the dimming function are used by taking into account their property of low electricity consumption; and the dimming function is also made to be remote-controllable via Wi-Fi.

Meanwhile, the lighting system need not be limited to include the LED lighting devices 500. Alternatively, for example, it is also possible to use incandescent lamps or fluorescent lamps.

Regarding each air-conditioning device 700, the power ON/OFF control is remotely performed by the control server device 200. That is, each air-conditioning device 700 is configured to be individually remote-controllable, and not only the power ON/OFF but also the wind direction and the air blower intensity are treated as the targets for control. In the present embodiment, no control is performed regarding the temperature and the humidity of the blown air. However, that is not the only possible case. That is, the temperature and the humidity can also be treated as the targets for control.

Each tap 600 includes a plurality of tap openings, and the ON/OFF control of electrical power supply to each tap opening is remotely performed by the control server device 200. That is, in each tap 600, ON/OFF switches are disposed in units of tap openings in an individually remote-controllable manner. The ON/OFF control is performed by the control server device 200 using a wireless control system. Meanwhile, a single tap 600 can include an arbitrary number of tap openings. As an example, the configuration can be such that a single tap is made of four tap openings.

As illustrated in FIG. 6, a single tap 600 is installed at each table. To each tap 600, electrical devices (not illustrated) can be connected. More particularly, to each tap 600 can be connected desktop PCs, display devices, notebook PCs, printers, and battery chargers.

In the present embodiment, to a tap opening of each tap 600 is connected the power source of a display device that has significance from the perspective of facing persons. The display device can be controlled by the control server device 200 by means of performing ON/OFF control of electrical power supply to the corresponding tap opening.

If a desktop PC main body or a printer device is connected to the tap 600, the device configuration is such that ON/OFF control of electrical power supply to the tap opening cannot be performed from the control server device 200. For that reason, as far as the desktop PC main body is concerned, control software is installed that switches the desktop PC main body to an energy saving mode or shuts down the desktop PC main body via a network with the aim of performing energy saving control. As far as switching back from the energy saving mode or the shutdown state is concerned, the user does it manually.

If a battery recharger or a notebook PC to be recharged is connected to the tap 600, then the electrical power supply is always kept ON by taking convenience into account. Meanwhile, the devices that can be connected to the tap openings of the taps 600 are not limited to the abovementioned devices.

Returning to the explanation with reference to FIG. 1, the positioning server device 100 receives the detection data from each sensor; detects the position and the action status of the person wearing those sensors; and sends the position and the action status to the control server device 200 and the arbitration server device 800.

Figure 7:
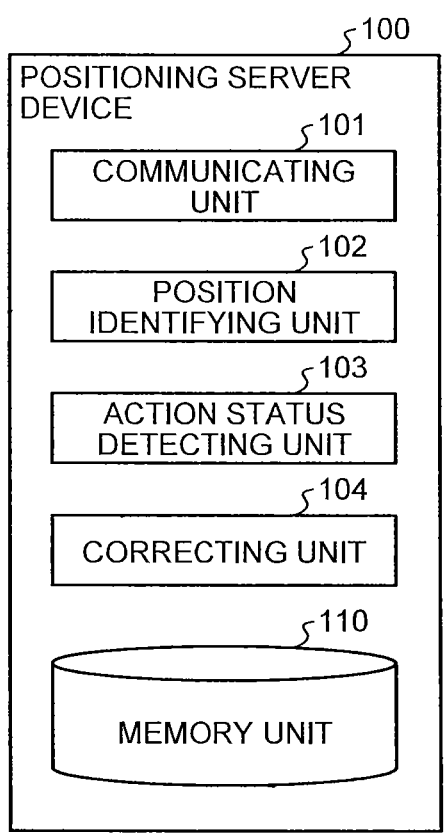
FIG. 7 is a block diagram illustrating a functional configuration of a positioning server device.

FIG. 7 is a block diagram illustrating a functional configuration of the positioning server device 100. As illustrated in FIG. 7, the positioning server device 100 mainly includes a communicating unit 101, a position identifying unit 102, an action status detecting unit 103, a correcting unit 104, and a memory unit 110.

The memory unit 110 is a memory medium such as a hard disk drive (HDD) or a memory, and is used to store map data of the room that is treated as the target area for control.

The communicating unit 101 receives, at regular time intervals, detection data either from the acceleration sensor, the angular velocity sensor, and the geomagnetic sensor installed in each smartphone 300; or from the acceleration sensor, the angular velocity sensor, and the geomagnetic sensor of each sensor group 301 that is used separately from the smartphone 300. That is, the communicating unit 101 receives an acceleration vector from each acceleration sensor, receives an angular velocity vector from each angular velocity sensor, and receives a magnetic orientation vector from each geomagnetic sensor.

Moreover, the communicating unit 101 receives captured images from the monitoring cameras 400. Furthermore, the communicating unit 101 sends the action status such as the absolute position, the direction, and the position of a person (described later) to the control server device 200 and the arbitration server device 800.

The position identifying unit 102 analyzes the received detection data, and identifies the absolute position of a person in the room to an accuracy of the shoulder width or the stride length of that person. Regarding the method by which the position identifying unit 102 identifies the absolute position of a person, the details are given later.

The action status detecting unit 103 analyzes the received detection data, and detects the action status of the person. In the present embodiment, the action status detecting unit 103 detects, as the action status, whether the person is in a stationary state or in a walking state. If the action status points to the stationary state; then, based on the detection data, the action status detecting unit 103 detects the action status such as the direction of the person with respect to the devices in the target area for control and whether the posture of the person indicates a standing state or a seated state.

Thus, if it is detected from the captured images, which is obtained from the monitoring cameras 400, that a person has entered the room from the door; then the action status detecting unit 103 determines in a sequential manner whether the action status of that person points to the walking state or the stationary state. For that, the action status detecting unit 103 refers to time-series data of acceleration vectors and time-series data of angular velocity vectors from among the detection data received in a sequential manner either from the acceleration sensor, the angular velocity sensor, and the geomagnetic sensor installed in the smartphone 300 held by the person who entered the room or from the acceleration sensor, the angular velocity sensor, and the geomagnetic sensor of the sensor group 301 worn separately from the smartphone 300. Herein, regarding implementation of the method of referring to acceleration vectors and angular velocity vectors and accordingly determining whether or not the action status of a person points to a walking state; operations of a dead reckoning device disclosed in Japanese Patent No. 4243684 are carried out. Then, as a result of implementing this method, if it is determined that the person is not in the walking state, then the action status detecting unit 103 determines that the person is in the stationary state.

More particularly, in an identical manner to the operations performed by the dead reckoning device disclosed in Japanese Patent No. 4243684, the action status detecting unit 103 detects the action status of a person in the following manner.

The action status detecting unit 103 obtains a gravitational acceleration vector from an acceleration vector received from the acceleration sensor and an angular velocity vector received from the angular velocity sensor; subtracts the gravitation acceleration vector from the acceleration vector; removes the acceleration in the vertical direction; and obtains time-series data of the residual acceleration component. Then, the action status detecting unit 103 performs principal component analysis with respect to the time-series data of the residual acceleration component, and obtains the travelling direction of the walking action. Moreover, the action status detecting unit 103 searches for the pair of the top peak and the bottom peak of the acceleration component in the vertical direction, as well as searches for the pair of the bottom peak and the top peak of the acceleration component in the travelling direction. Then, the action status detecting unit 103 calculates the gradient of the acceleration component in the travelling direction.

Moreover, the action status detecting unit 103 determines whether or not, at the bottom peak detection timing at which the acceleration component in the vertical direction changes to the bottom peak from the top peak, the gradient of the acceleration component in the travelling direction is equal to or greater than a predetermined value. When the gradient is equal to or greater than a predetermined value, the action status detecting unit 103 determines that the action status of the person points to the walking state.

On the other hand, in the operations described above, if no pair of the top peak and the bottom peak of the acceleration component in the vertical direction is retrieved, or if no pair of the top peak and the bottom peak of the acceleration component in the travelling direction is retrieved, or if, at the bottom peak detection timing at which the acceleration component in the vertical direction changes to the bottom peak from the top peak, the gradient of the acceleration component in the travelling direction is smaller than a predetermined value; then the action status detecting unit 103 determines that the action status of the person points to the stationary state.

If it is determined that a person is in the stationary state, then the position identifying unit 102 makes use of an acceleration vector, an angular velocity vector, and a magnetic orientation vector; and, with the position of shoulders serving as a reference position, obtains a relative movement vector from the reference position to the position at which the person is determined to be in the stationary state. Herein, regarding the method of calculating the relative movement vector using an acceleration vector, an angular velocity vector, and a magnetic orientation vector; the operations of a dead reckoning device disclosed in Japan Patent Application Laid-open No 2011-47950 are carried out.

More particularly, in an identical manner to the operations performed in the dead reckoning device disclosed in Japan Patent Application Laid-open No. 2011-47950, the position identifying unit 102 obtains the relative movement vector in the following manner.

The position identifying unit 102 obtains a gravitational orientation vector from an acceleration vector received from the acceleration sensor and an angular velocity vector received from the angular velocity sensor; and calculates a posture angle of the person as the movement orientation from the gravitational orientation vector and the angular velocity vector or a magnetic orientation vector obtained from the geomagnetic sensor. Moreover, the position identifying unit 102 obtains a gravitational acceleration vector from an acceleration vector received from the acceleration sensor and an angular velocity vector received from the angular velocity sensor; and, from the gravitation acceleration vector and the acceleration vector, calculates an acceleration vector generated due to the walking state. Then, from the gravitational acceleration vector and the acceleration vector generated due to the walking state, the position identifying unit 102 analyzes and detects the walking action; measures, based on the detection result, the magnitude of the walking action based on the gravitation acceleration vector and the acceleration vector generated by the walking action; and sets the measurement result as the stride length. Then, the position identifying unit 102 multiplies the movement orientation and the length stride, and obtains the relative movement vector from the reference position. Thus, the position of a person is detected at real time to an accuracy of the shoulder width or the stride length of that person, that is, to an accuracy of about 60 cm or less (more particularly, to the extent of about 40 cm or less).

In this way, once the relative movement vector is calculated, the position identifying unit 102 identifies the post-movement absolute position of the person by referring to the relative movement vector from the door and the map data of the room as stored in the memory unit 110.

With that, it becomes possible to even identify the position of the table in the room at which the person is present. As a result, the position of the person can be identified to an accuracy of the shoulder width of that person, that is, to an accuracy of about 60 cm or less (more particularly, to the extent of about 40 cm or less).

Herein, greater the position accuracy, better is the result. However, it is not always necessary to achieve the accuracy to the level of 1 cm. For example, in a situation in which two persons are having a conversation, the conversation hardly happens with their bodies making contact. Rather, the conversation between the persons happens with some distance maintained from each other. In that regard, as far as the accuracy is concerned, the accuracy equivalent to the shoulder width or the stride length of a person is considered to be the appropriate accuracy in the present embodiment. Moreover, regarding whether the person is standing or sitting, the accuracy equivalent to the length from the waist to the knees is considered to be the appropriate accuracy in the present embodiment.

According to the anthropometric data released by the Ministry of Health, Labour, and Welfare (Makiko Kouchi, Masaaki Mochimaru, Hiromu Iwasawa, and Seiji Mitani (2000): Anthropometric database for Japanese population 1997-98, Japanese Industrial Standards Center (AIST, MITI)), the data corresponding to the shoulder width (the acromial width) of young and aged men as well as young and aged women indicates that the shoulder width ranges between the lowest width of about 35 cm (34.8 cm) in an aged woman to the highest width of about 40 cm (39.7 cm) in a young man. Moreover, similarly, the difference between the waist and the knees (the difference between the height of the superior margin of the symphysis pubis and the height of the lateral epicondyle of femur) is about 34 cm to about 38 cm. Regarding the stride length of a person while moving, in the case of walking for a distance of 50 m; 95 steps are taken and the stride length comes to about 53 cm (50÷95× 10). Thus, in the position detection method according to the present invention, it is possible achieve the accuracy equivalent to the stride length. According to the data mentioned above, in the present embodiment, the configuration is such that the accuracy of 60 cm or less, desirably 40 cm or less, is considered to be appropriate. Meanwhile, although the data mentioned above serves as a guideline for the standard to be followed while considering the accuracy; the data is based only on Japanese persons and is not limited to the values mentioned above.

In the case when the absolute position of the person is identified and when the person is in the stationary state in a seat in front of a table, the action status detecting unit 103 refers to the orientation of the magnetic orientation vector received from the geomagnetic sensor and determines the direction (orientation) of the person with respect to the display device. Moreover, when the person is in the stationary state in a seat in front of a table, the action status detecting unit 103 refers to the acceleration component in the vertical direction of the acceleration vector and determines the posture of the person, that is, determines whether the person is in the standing state or in the seated state.

Regarding the determination of whether the person is in the standing state or in the seated state, in an identical manner to the dead reckoning device disclosed in Japanese Patent No. 4243684, a gravitational acceleration vector is obtained from an acceleration vector received from the acceleration sensor and an angular velocity vector received from the angular velocity sensor, and the acceleration component in the vertical direction is obtained. Then, in an identical manner to the dead reckoning device disclosed in Japanese Patent No. 4243684, the action status detecting unit 103 obtains the top peak and the bottom peak of the acceleration component in the vertical direction.

Figure 8:
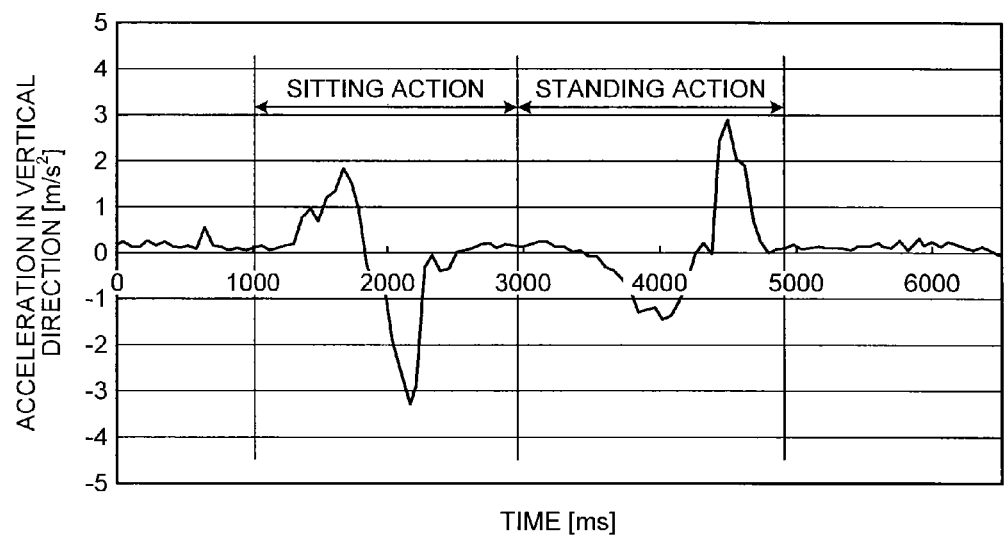
FIG. 8 is a diagram illustrating a waveform of an acceleration component in the vertical direction in the case when a sitting action and a standing action are performed.

FIG. 8 is a diagram illustrating a waveform of the acceleration component in the vertical direction in the case when a sitting action and a standing action are performed. As illustrated in FIG. 8, in the case of the sitting action, the acceleration component in the vertical direction has a time interval of about 0.5 seconds and thereabout from the top peak to the bottom peak. On that other hand, in the case of the standing action, the acceleration component in the vertical direction has a time interval of about 0.5 seconds and thereabout from the bottom peak to the top peak. Thus, depending on the time interval, between peaks, the action status detecting unit 103 determines whether the person is in the seated state or in the standing state. That is, if the acceleration component in the vertical direction has a time interval within a predetermined range from 0.5 seconds from the top peak to the bottom peak, then the action status detecting unit 103 determines that the action status of the person points to the seated state. On the other hand, if the acceleration component in the vertical direction has a time interval within a predetermined range from 0.5 seconds from the bottom peak to the top peak, then the action status detecting unit 103 determines that the action status of the person points to the standing state.

In this way, when the action status detecting unit 103 detects whether the action status of the person is the standing state or the seated state, it means that the position of the person in the height direction has been detected to an accuracy of about 50 cm or less (more particularly, about 40 cm or less).

Moreover, as illustrated in the example in FIG. 3, in the case when the smartphone 300 equipped with information devices such as an acceleration sensor, an angular velocity sensor, and a geomagnetic sensor that detect the actions of the person is worn on the waist and when the compact headset sensor group 301 that includes an acceleration sensor, an angular velocity sensor, and a geomagnetic sensor also worn in the head region; the action status detection unit 103 can further detect the posture and the actions of the person in the following manner.

Figure 9:
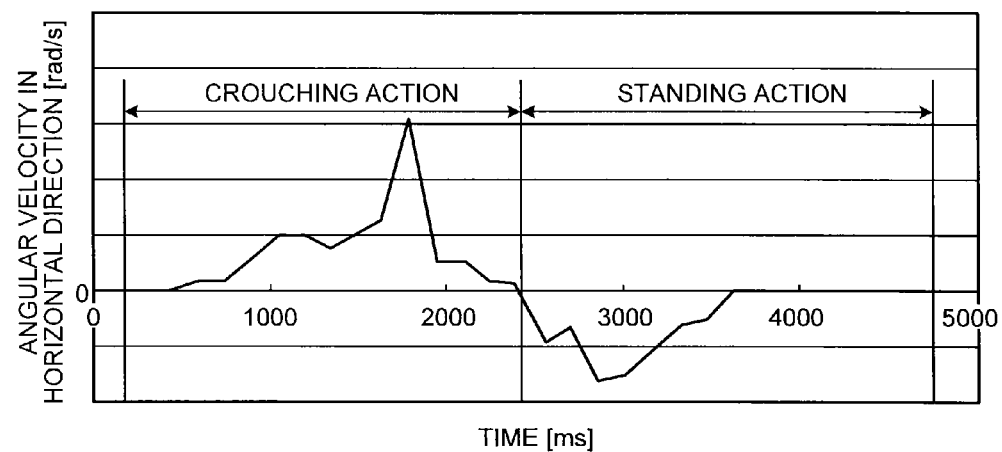
FIG. 9 is a diagram illustrating a waveform of an angular velocity component in the horizontal direction in the case when a crouching action and a standing action are performed.

FIG. 9 is a diagram illustrating a waveform of the angular velocity component in the horizontal direction in the case when a crouching action and a standing action are performed. If acceleration data obtained from the acceleration sensors is used, a waveform is obtained that is similar to the waveform of the sitting action and the standing action illustrated in FIG. 8. However, if only the acceleration data is used, then it is difficult to differentiate between a crouching action and a standing action.

For that reason, along with the method of differentiating between a sitting action and a standing action based on the waveform illustrated in FIG. 8, the action status detecting unit 103 determines whether or not the temporal changes in angular velocity data in the horizontal direction as received from the angular velocity sensor match with the waveform illustrated in FIG. 9, and accordingly differentiates between a crouching action and a standing action.

More particularly, firstly, the action status detecting unit 103 determines whether or not the acceleration component in the vertical direction based on the acceleration vectors received from the acceleration sensor has a time interval within a predetermined range from 0.5 seconds from the top peak to the bottom peak.

When the acceleration component in the vertical direction has a time interval within a predetermined range from 0.5 seconds from the top peak to the bottom peak, if the angular velocity component in the horizontal direction of the angular velocity vector received from the angular velocity sensor increases gradually from zero before undergoing an exponential increase to reach the top peak and then decreases exponentially before gradually returning to zero as illustrated in the waveform in FIG. 9 and if this increase and decreases takes a time period of 2 seconds; then the action status detecting unit 103 determines that the person has performed a crouching action.

Moreover, the action status detecting unit 103 determines whether or not the acceleration component in the vertical direction has a time interval within a predetermined range from 0.5 seconds from the bottom peak to the top peak. When the acceleration component in the vertical direction has a time interval within a predetermined range from 0.5 seconds from the bottom peak to the top peak, if the angular velocity component in the horizontal direction of the angular velocity vector received from the angular velocity sensor reaches to the bottom peak from zero in a stepwise manner and then gradually returns to zero from the bottom peak as illustrated in the waveform in FIG. 9 and if this increase and decreases takes a time period of 1.5 seconds; then the action status detecting unit 103 determines that the person has performed a standing action.

Regarding the angular velocity vector used by the action status detecting unit 103 for determining a crouching action and a standing action, it is desirable to use the angular velocity vector received by the angular velocity sensor worn in the head region. That is because of the reason that, while performing a crouching action or a standing action, the angular velocity component in the horizontal direction that is based on the angular velocity vector received from the angular velocity sensor worn in the head region prominently exhibits the waveform illustrated in FIG. 9.

Figure 10:
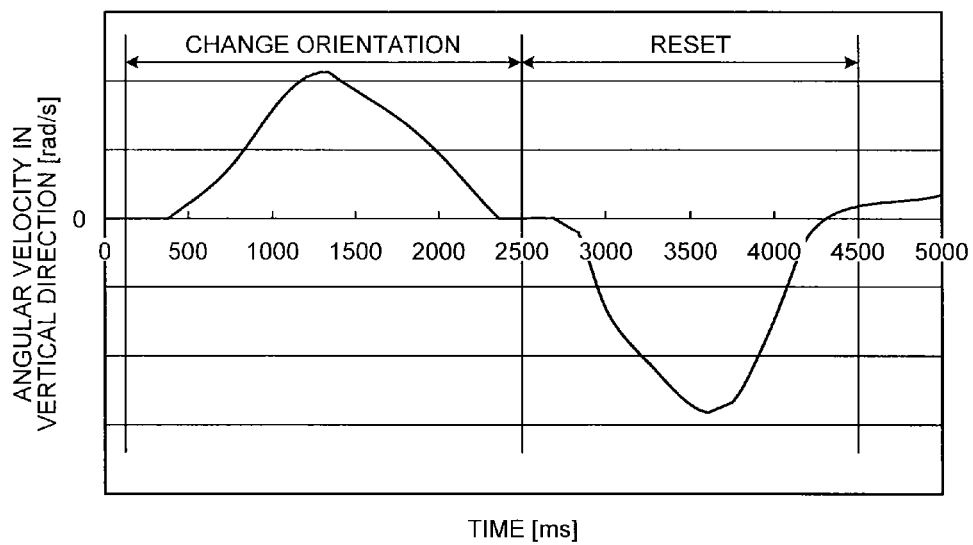
FIG. 10 is a diagram illustrating a waveform of the angular velocity component in the vertical direction in the case when an action of changing the orientation is performed in the stationary state.

FIG. 10 is a diagram illustrating a waveform of the angular velocity component in the vertical direction in the case when the person makes an action of changing his or her direction by almost 90° in the stationary state. If the angular velocity component in the vertical direction is positive, then the direction is changed to the right-hand side. However, if the angular velocity component in the vertical direction is negative, then the direction is changed to the left-hand side.

If the temporal changes in the angular velocity component in the vertical direction of the angular velocity vector as received from the angular velocity sensor indicate that the angular velocity component gradually reaches the top peak from zero and then gradually returns to zero to match with the waveform illustrated in FIG. 10 and if this increase and decreases takes a time period of 3 seconds; then the action status detecting unit 103 determines that the person has changed the direction to the right-hand side.

However, if the temporal changes in the angular velocity component in the vertical direction indicate that the angular velocity component gradually reaches the bottom peak from zero and then gradually returns to zero to match with the waveform illustrated in FIG. 10 and if this increase and decreases takes a time period of 1.5 seconds; then the action status detecting unit 103 determines that the person has changed the direction to the left-hand side.

If the operating angular velocity component in the vertical direction of the angular velocity vector received not only from the angular velocity sensor worn in the head region but also from the smartphone 300 worn on the waist are determined to exhibit temporal changes similar to the waveform illustrated in FIG. 10, then the action status detecting unit 103 determines that the person performs an action of changing the orientation of the entire body to the right-hand side or to the left-hand side.

However, if the operating angular velocity component in the vertical direction of the angular velocity vector received from the angular velocity sensor worn in the head region is determined to exhibit temporal changes similar to the waveform illustrated in FIG. 10 but if the operating angular velocity component in the vertical direction of the angular velocity vector received from the angular velocity sensor of the smartphone 300 worn on the waist is determined to exhibit temporal changes that are totally different than the waveform illustrated in FIG. 10, then the action status detecting unit 103 determines that the direction of only the head region has changed to the right-hand side or the left-hand side. Such an action points to, for example, a posture action in the case when a user communicates with the neighboring user while in the seated state.

Figure 11:
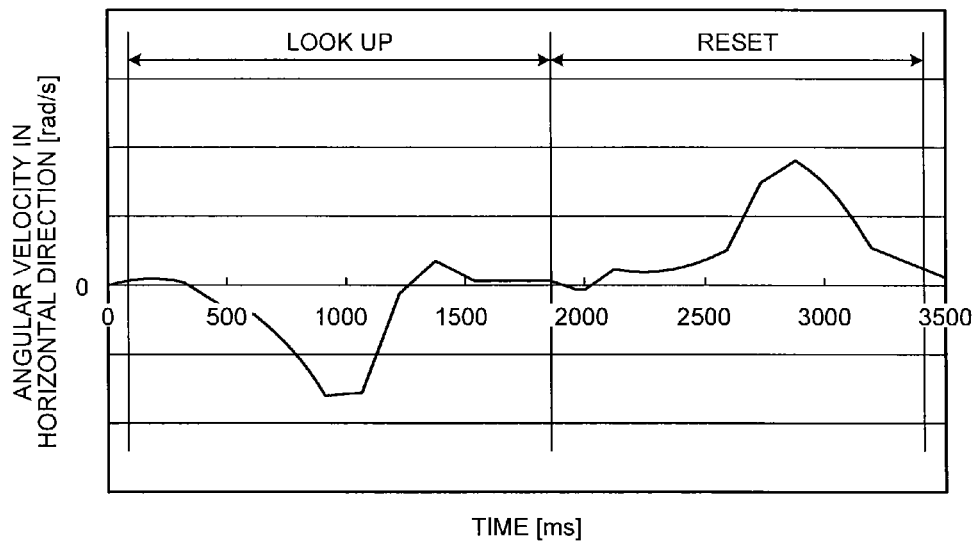
FIG. 11 is a diagram illustrating a waveform of the angular velocity component in the horizontal direction of the angular velocity vector received by the angular velocity sensor worn in the head region in the case when a person has changed the direction of eyes from a display to the upper direction while in the seated state.

FIG. 11 is a diagram illustrating a waveform of the angular velocity component in the horizontal direction of the angular velocity vector received from the angular velocity sensor worn in the head region in the case when a person has changed the direction of eyes from the display to the upper direction while in the seated state.

Consider a case in which the position identifying unit 102 identifies that the absolute position of a person is in front of a table and the action status detecting unit 103 detects that the person in front of the table is in a seated state. In such a case, if the angular velocity component in the horizontal direction of the angular velocity vector received from the angular velocity sensor worn in the head region of that person exhibits the waveform illustrated in FIG. 11 in which the angular velocity component gradually reaches the bottom peak from zero and then exponentially returns to zero and if this increase and decreases takes a time period of 1 second, then the action status detecting unit 103 determines that the person has changed the direction of eyes from the display to the upper direction (i.e., has looked up) while in the seated state. Moreover, if the angular velocity component in the horizontal direction exhibits the waveform illustrated in FIG. 11 in which the angular velocity component gradually increases from zero to reach the top peak and then gradually returns to zero and if this increase and decreases takes a time period of 1.5 seconds, then the action status detecting unit 103 determines that the person has reset the direction of eyes on the display from the state in which the direction of eyes was changed from the display to the upper direction while in the seated state.

Figure 12:
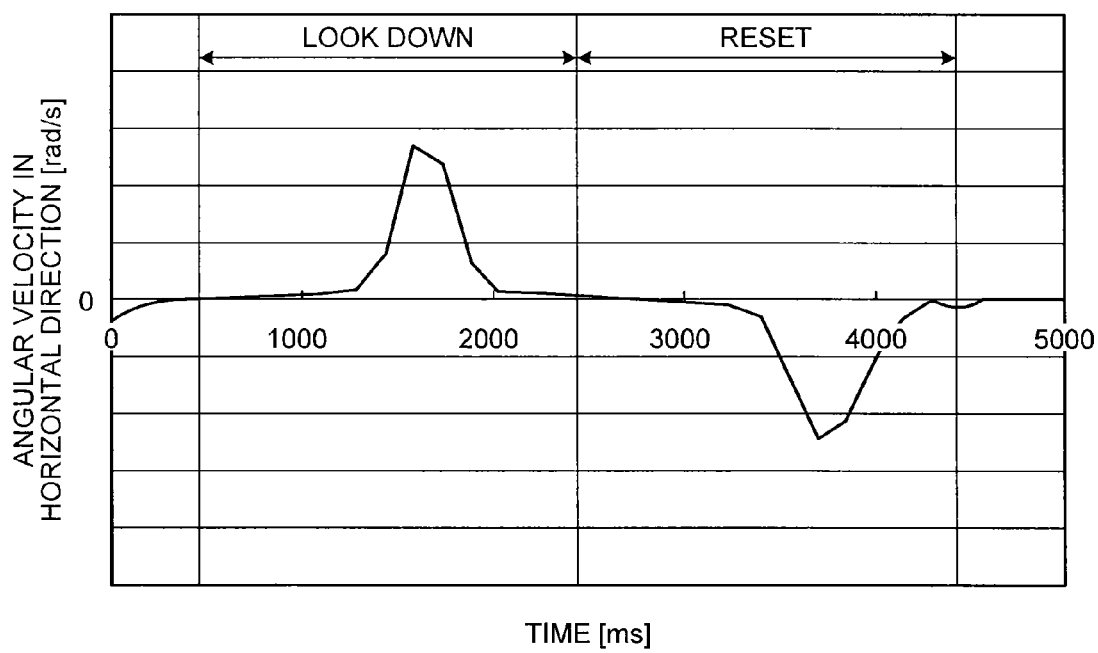
FIG. 12 is a diagram illustrating a waveform of the angular velocity component in the horizontal direction of the angular velocity vector received by the angular velocity sensor worn in the head region in the case when a person has changed the direction of eyes from a display to the lower direction while in the seated state.

FIG. 12 is a diagram illustrating a waveform of the angular velocity component in the horizontal direction of the angular velocity vector received from the angular velocity sensor worn in the head region in the case when a person has changed the direction of eyes from the display to the lower direction while in the seated state.

Consider a case in which the position identifying unit 102 identifies that the absolute position of a person is in front of a table and the action status detecting unit 103 detects that the person in front of the table is in a seated state. In such a case, if the angular velocity component in the horizontal direction of the angular velocity vector received from the angular velocity sensor worn in the head region of that person exhibits the waveform illustrated in FIG. 12 in which the angular velocity component exponentially reaches the top peak from zero and then exponentially returns to zero and if this increase and decreases takes a time period of 0.5 seconds, then the action status detecting unit 103 determines that the person has changed the direction of eyes from the display to the lower direction (i.e., has looked down) while in the seated state.

Moreover, if the angular velocity component in the horizontal direction exhibits the waveform illustrated in FIG. 12 in which the angular velocity component exponentially decreases from zero to reach the bottom peak and then exponentially returns to zero and if this increase and decreases takes a time period of 1 second, then the action status detecting unit 103 determines that the person has reset the direction of eyes on the display from the state in which the direction of eyes was changed from the display to the lower direction while in the seated state.

In this way, by implementing the method described above, the action status detecting unit 103 becomes able to determine everyday postures and actions that can be performed by an office staff member. That is, the action status detecting unit 103 becomes able to determine walking (in a standing state), standing (in a stationary state), sitting in a chair, crouching during work, changing the orientation (direction) in the seated state or the standing state, looking up in the seated state or the standing state, and looking down in the seated state or the standing state.

Meanwhile, if the technology of the dead reckoning device disclosed in Japanese Patent No. 4243684 is to be used, then an up-down movement of a person in an elevator is also determined using the acceleration component in the vertical direction as disclosed in Japanese Patent No. 4243684.

For that reason, in the present embodiment, at a place where there is no elevator, if the acceleration component in the vertical direction illustrating the waveform illustrated in FIG. 8 is detected; then, using the functions of a map matching device disclosed in Japan Patent Application Laid-open No. 2009-14713, the action status detecting unit 103 can determine with high accuracy that a standing action or a sitting action is performed that is different than an up-down movement in an elevator as detected by the dead reckoning device disclosed in Japanese Patent No. 4243684.

Thus, In the present embodiment, the action status of a person, the relative movement vector from a reference position, and the posture (whether the standing state or the seated state) are detected using a technology identical to the dead reckoning devices disclosed in Japanese Patent No. 4243684 and Japan Patent Application Laid-open No. 2011-47950. However, the method of detection is not limited to such technologies. Moreover, in the explanation given above, when the action status of a person is determined to be the stationary state, the position of that person is identified and the orientation and the posture of that person is detected. In addition to that, the configuration can be such that, also when the action status of a person indicates the walking state, the positions of the person are sequentially identified and the orientations and the postures are sequentially detected.

The correcting unit 104 corrects the identified absolute position and the detected action status (the orientation and the posture) based on the captured images obtained from the monitoring cameras 400 and the map data stored in the memory unit 110. More particularly, the correcting unit 104 determines whether or not the identified absolute position, the detected orientation, and the detected posture of a person are correct by performing image analysis of the captured images obtained from the monitoring cameras 400 or by implementing the functions of the map matching device disclosed in Japan Patent Application Laid-open No. 2009-14713. In case the identified absolute position, the detected orientation, or the detected posture of a person is not correct; then the correcting unit 104 performs correction to the correct absolute position, the correct orientation, or the correct posture either obtained from the captured images or obtained as a result of implementing the map matching function.

Meanwhile, the correction need not be performed using only the captured images obtained from the monitoring cameras 400. Alternatively, the configuration can be such that correction is performed by implementing a determinative technique such as short-range wireless communication using a radio-frequency identification device (RFID) or Bluetooth (registered trademark), or optical communication.

Moreover, in the present embodiment, the action status of a person, the relative movement vector from a reference position, and the posture (whether the standing state or the seated state) of the person are detected using a technology identical to the dead reckoning devices disclosed in Japanese Patent No. 4243684 and Japan Patent Application Laid-open No. 2011-47950 and using a technology identical to the map matching device disclosed in Japan Patent Application Laid-open No. 2009-14713. However, the method of detection is not limited to using such technologies.

Given below is the explanation of the details of the control server device 200. Herein, based on the position and the action status (the orientation and the posture) of a person present in the room serving as the target area for control, the control server device 200 controls the LED lighting devices 500, the taps 600, and the air-conditioning devices 700 in a remote manner via a network.

Figure 13:
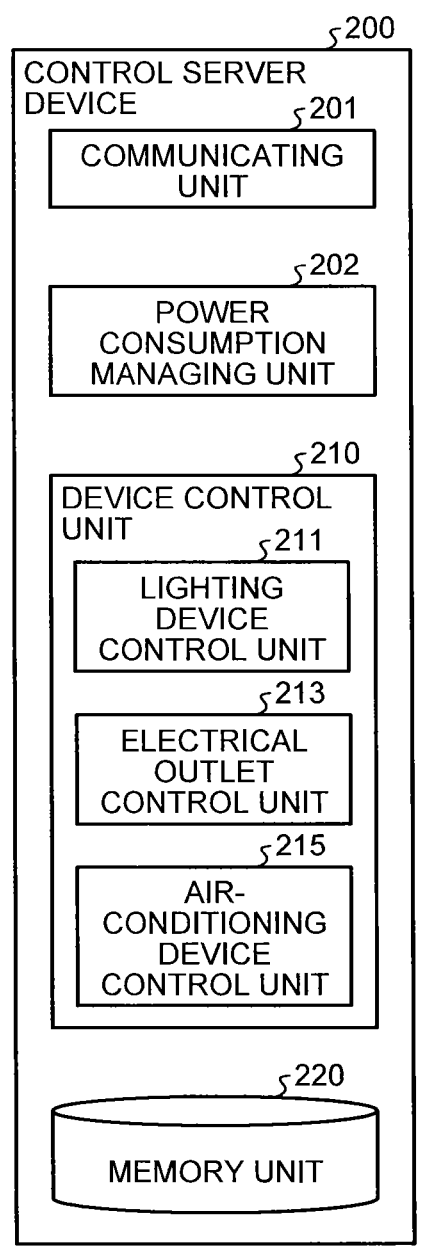
FIG. 13 is a block diagram illustrating a functional configuration of a control server device according to the present embodiment.

FIG. 13 is a block diagram illustrating a functional configuration of the control server device 200 according to the present embodiment. As illustrated in FIG. 13, the control server device 200 according to the present embodiment mainly includes a communicating unit 201, a power consumption managing unit 202, a device control unit 210, and a memory unit 220.

The memory unit 220 is a memory medium such as an HDD or a memory, and is used to store position data of the room that is treated as the target area for control.

The communicating unit 201 receives, from the positioning server device 100, the absolute position and action information (the orientation and the posture) of a person. Moreover, the communicating unit 201 receives (as an obtaining unit) the power consumption of the LED lighting devices 500, the power consumption of the electrical devices connected to the taps 600, and the power consumption of the air-conditioning devices 700. Furthermore, the communicating unit 201 sends control signals for performing electrical power control with respect to the LED lighting devices 500, the taps 600, and the air-conditioning devices 700. Regarding the method by which the communicating unit 201 obtains (receives) the power consumption; as far as the power consumption of each electrical device (including the LED lighting devices 500 and the air-conditioning devices 700) is obtained in chronological order, any method can be implemented. For example, if each tap 600 has the function of measuring the power consumption of the electrical devices connected thereto and sending the power consumption, then the communicating unit 201 can obtain the power consumption of the electrical devices from the taps 600.

The power consumption managing unit 202 manages the power consumption received from the LED lighting devices 500, the electrical devices connected to the taps 600, and the air-conditioning devices 700. For example, in a memory unit such as the memory unit 220, the power consumption managing unit 202 stores the power consumption obtained in chronological order on a device-by-device basis.

The device control unit 210 includes a lighting device control unit 211, an electrical outlet control unit 213, and an air-conditioning device control unit 215. The lighting device control unit 211 controls the LED lighting devices 500 based on the absolute position and the action information (the orientation and the posture) of a person. More particularly, if a person is in the seated state, then the lighting device control unit 211 sets the LED lighting devices 500 in the neighborhood of the received absolute position to have a narrower lighting range than a predetermined range, and sends via the communicating unit 201 a control signal for setting the lighting intensity to a higher value than a predetermined threshold value. As a result, with respect to a user who is working in the seated state, the lighting can be controlled to ensure a lighting range and a lighting intensity suitable for detailed-oriented tasks.

On the other hand, if a person is in the standing state, then the lighting device control unit 211 sets the LED lighting devices 500 in the neighborhood of the received absolute position to have a wider lighting range than the predetermined range, and sends via the communicating unit 201 a control signal for setting the lighting intensity to a lower value than a predetermined threshold value. As a result, the lighting can be controlled to ensure a lighting range and a lighting intensity suitable for a user in the standing state to look over the entire room.

The electrical outlet control unit 213 performs ON/OFF control of the power source with respect to the tap openings of the taps 600 based on the absolute position and the action information (the orientation and the posture) of each person. More particularly, with respect to a display device that is connected to the tap 600 installed in the neighborhood of a received absolute position, if the person is in the seated state and has the display device in his or her anterior direction, then the electrical outlet control unit 213 sends via the communicating unit 201 a control signal for turning ON the switch of the tap opening to which the display device is connected in the tap 600.

On the other hand, with respect to the display device that is connected to the tap 600, if the person is in the standing state or has the display device in his or her posterior direction, then the electrical outlet control unit 213 sends via the communicating unit 201 a control signal for turning OFF the switch of the tap opening to which the display device is connected in the tap 600.

In this way, since the display device has significance from the perspective of facing persons and since the anterior position of the display device enables determination that the display device is in use, electrical power control is performed depending on the orientation of the person with respect to the display device. Moreover, when the posture of the person indicates the seated state, it can be determined that the display device is in use. In this way, in the embodiment, electrical power control is performed by taking into account the actual use of devices. Hence, as compared to the case in which electrical power control is performed depending only on the distance from the devices, it becomes possible to perform a detailed control.

Furthermore, the electrical outlet control unit 213 according to the embodiment performs electrical power control of each desktop PC main body and each display device in conjunction with personal recognition information of the corresponding user.

The air-conditioning device control unit 215 performs ON/OFF control of the power source of the air-conditioning devices 700 based on the absolute position of a person. More particularly, the air-conditioning device control unit 215 sends via the communicating unit 201 a control signal for turning ON the air-conditioning device 700 set in the group including the seat corresponding to the received absolute position.

Figure 14:
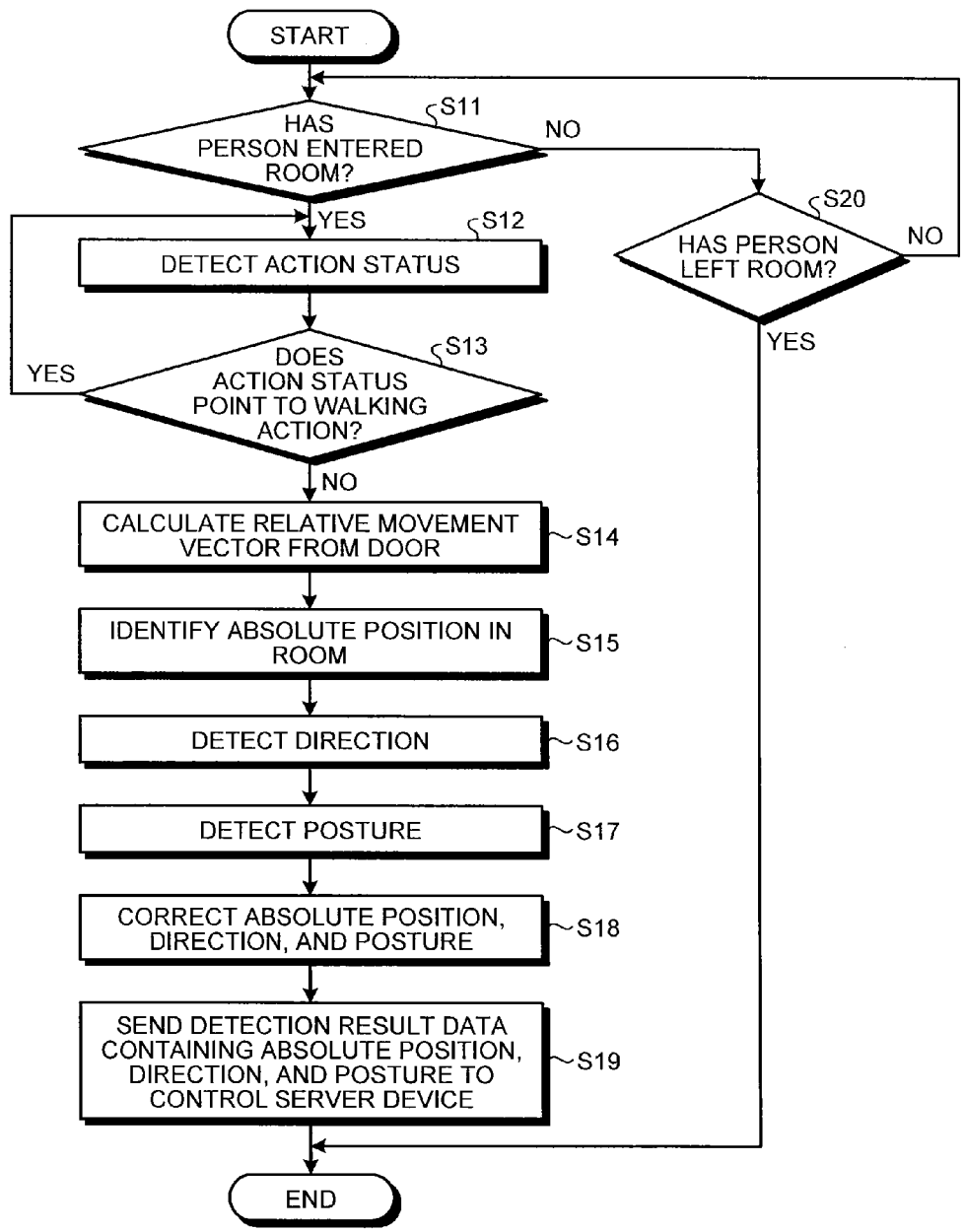
FIG. 14 is a flowchart for explaining a sequence of operations during a detection operation performed by the positioning server device according to the present embodiment.

Given below is the explanation of a detection operation performed by the positioning server device 100 configured in the abovementioned manner according to the present embodiment. FIG. 14 is a flowchart for explaining a sequence of operations during the detection operation performed by the positioning server device 100 according to the present embodiment. The detection operation illustrated in the flowchart is performed with respect to each of a plurality of smartphones 300.

Meanwhile, in a separate manner from the detection operation illustrated in the flowchart, the positioning server device 100 receives detection data (the acceleration vectors, the angular velocity vectors, and the magnetic orientation vectors) either from the acceleration sensors, the angular velocity vectors, and the geomagnetic sensors installed in a plurality of smartphones 300 or from the acceleration sensors, the angular velocity vectors, and the geomagnetic sensors independent of the smartphones 300; and receives captured images from a plurality of monitoring cameras 400.

Firstly, whether or not a person has entered the room, which is treated as the target area for control, is determined according to captured images of an openable-closable door (Step S11). If no person has entered the room (No at Step S11), the positioning server device 100 determines whether or not any person has left the room (Step S20). If no person has left the room (No at Step S20), the system control returns to Step S11 and the operations are repeated. On the other hand, if a person has left the room (Yes at Step S20), that marks the end of the detection operation. Meanwhile, if a person has entered the room (Yes at Step S11), then the action status detecting unit 103 detects the action status of that person according to the method described above (Step S12). Subsequently, the action status detecting unit 103 determines whether or not the action status of the person points to the walking action (Step S13). If the action status of the person points to the walking state (Yes at Step S13), then the detection of the action status is performed in a repeated manner.

On the other hand, if the action status of the person does not point to the walking state (No at Step S13), then the action status detecting unit 103 determines that the action status of the person points to the stationary state. In that case, the position identifying unit 102 implements the method described above and calculates a relative movement vector from the door with the door as the reference position (Step S14).

Then, the position identifying unit 102 refers to the map data of the room stored in the memory unit 110 and the relative movement vector from the door, and identifies the absolute position of the person in the stationary state (Step S15). With that, the position identifying unit 102 can identify the position of the table placed in the room at which the person is present. As a result, the position of the person can be detected to an accuracy of the shoulder width of the person (to an accuracy of about 60 cm or less; more particularly, to an accuracy of about 40 cm or less).

Then, the action status detecting unit 103 detects, as the further action status of the person in the stationary state, the direction (orientation) with respect to the display device from the magnetic orientation vector received from the geomagnetic sensor (Step S16).

Then, the action status detecting unit 103 detects, as the action status of the person, whether the posture of the person points to the seated state or the standing state by implementing the method described above (Step S17). As a result, the action status detecting unit 103 detects the position of the person in the height direction to an accuracy of about 50 cm or less (more particularly, about 40 cm or less).

Moreover, the action status detecting unit 103 can also detect whether the action status of the person points to a crouching action or a standing action, or points to an action of changing the orientation in the seated state or an action of resetting the orientation, points to an action of raising the direction of eyes while in the seated state or an action of resetting the direction of eyes, or points to an action of lowering the direction of eyes while in the seated state or an action of resetting the direction of eyes.

Then, as described above, the correcting unit 104 determines whether or not correction is required with respect to the identified absolute position and the detected direction and posture; and performs correction if necessary (Step S18).

Subsequently, the communicating unit 101 sends to the control server device 200 the identified absolute position and the detected direction and posture (if correction has been performed, then the post-correction absolute position and the corrected direction and posture) as detection result data (Step S19).

Figure 15:
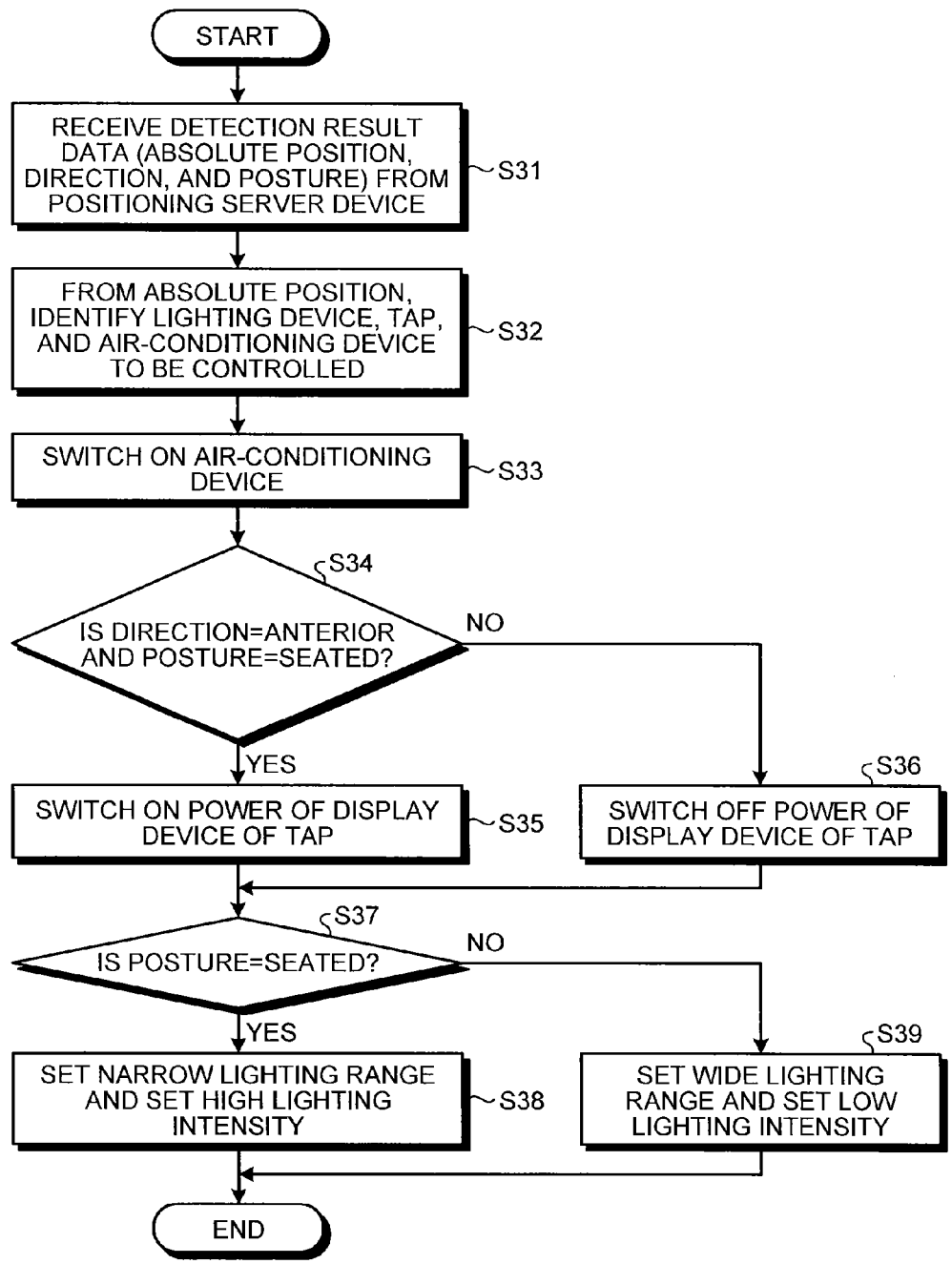
FIG. 15 is a flowchart for explaining a sequence of operations performed during a device control operation performed according to the embodiment.

Given below is the explanation of a device control operation performed by the control server device 200. FIG. 15 is a flowchart for explaining a sequence of operations performed during the device control operation performed according to the embodiment.

Firstly, the communicating unit 201 receives, from the positioning server device 100, the detection result data containing the absolute position, the direction, and the posture of a person (Step S31). Then, from the absolute position specified in the detection result data, the control units 211, 213, and 215 of the device control unit 210 respectively identify the LED lighting device 500 to be controlled, the tap 600 to be controlled, and the air-conditioning device 700 to be controlled (Step S32).

More particularly, the lighting device control unit 211 refers to the position data stored in the memory unit 220 and identifies, as the target for control, the LED lighting device 500 that is installed on the table corresponding to the absolute position. The electrical outlet control unit 213 refers to the position data stored in the memory unit 220 and identifies, as the target for control, the tap 600 installed in the neighborhood of the table corresponding to the absolute position. The air-conditioning device control unit 215 refers to the position data stored in the memory unit 220 and identifies, as the target for control, the air-conditioning device 700 installed for the group in which the table corresponding to the absolute position is placed.

Then, the air-conditioning device control unit 215 performs control to turn ON the air-conditioning device 700 that has been identified (Step S33).

Then, the electrical outlet control unit 213 determines whether or not the detection result data contains the anterior direction as the direction and contains the seated state as the posture (Step S34). If the detection result data contains the anterior direction as the direction and contains the seated state as the posture (Yes at Step S34), then the electrical outlet control unit 213 performs control to turn ON the switch of the tap opening to which the display device is connected in the tap 600 identified at Step S32 (Step S35).

On the other hand, if the detection result data contains the posterior direction as the direction or contains the standing state as the posture (No at Step S34), then the electrical outlet control unit 213 performs control to turn OFF the switch of the tap opening to which the display device is connected in the tap 600 identified at Step S32 (Step S36).

Then, the lighting device control unit 211 again determines whether or not the detection result data contains the seated state as the posture (Step S37). If the posture points to the seated state (Yes at Step S37), then the lighting device control unit 211 performs control to set the LED lighting device 500, which is identified at Step S32, to have a narrower lighting range than a predetermined range and to set the lighting intensity to a higher value than a predetermined threshold value (Step S38).

On the other hand, if the posture points to the standing state (No at Step S37), then the lighting device control unit 211 performs control to set the LED lighting device 500, which is identified at Step S32, to have a wider lighting range than a predetermined range and to set the lighting intensity to a lower value than a predetermined threshold value (Step S39).

Meanwhile, the control units 211, 213, and 215 of the device control unit 210 can be configured to also perform other types of control, other than the abovementioned control, with respect to the target devices for control.

Moreover, the control units 211, 213, and 215 of the device control unit 210 can be configured to perform control with respect to the target devices for control depending on whether the action status of a person points to a crouching action or a standing action, or points to an action of changing the orientation in the seated state or an action of resetting the orientation, points to an action of raising the direction of eyes (an action of looking up) while in the seated state or an action of resetting the direction of eyes, or points to an action of lowering the direction of eyes (an action of looking down) while in the seated state or an action of resetting the direction of eyes.

In such a case, as far as the actions, the target devices for control, and the control method are concerned; an example can be given as follows. These actions are expected to be performed when a staff member is assumed to be seated in front of a table. Herein, the target devices for control points to a PC or a PC display device, a desk lamp, and an electrical table fan functioning as an individual air-conditioning device.

For example, when a staff member is present at the table, if it is determined from the received detection result data that the crouching action is ongoing for a predetermined amount of time or beyond, then the electrical outlet control unit 213 can be configured to turn OFF the switch of the tap opening to which the power source of the PC is connected. Moreover, a mode control unit can be disposed in the device control unit 210 for the purpose of controlling the modes of the devices, and can be configured to switch the PC display device to a standby mode.

If a change from the seated state to the standing state is detected and if the standing state is ongoing for a predetermined amount of time or beyond, then the mode control unit can be configured to switch the PC to the standby mode and, at the same time, the electrical outlet control unit 213 can be configured to turn OFF the switch of the tap opening to which the power source of the display device is connected.

As far as an action of changing the orientation is concerned, an example of control can be given as below. If, from the seated state in front of a table, a change in the orientation of the face or the upper body is detected and if the changed state is ongoing for a predetermined amount of time or beyond; then it is possible to think of a situation in which the concerned staff member is in a conversation with another staff member present at a neighboring seat. Hence, the electrical outlet control unit 213 and the mode control unit can be configured to perform control in such a way that the PC, the display device, and the lighting device such as the desk lamp are switched to the standby mode or are switched OFF. When it is detected that the orientation of the concerned staff member is reset to the original state or is reset to the original posture, the electrical outlet control unit 213 and the mode control unit can be configured to perform control in such a way that the PC, the display device, and the lighting device such as the desk lamp are switched ON.

Meanwhile, it is possible to think that a staff member performs an action of looking down when reading documents placed on the table and it is possible to think that a staff member performs an action of looking up toward the ceiling when an idea comes up in his or her mind or when thinking of something. For that reason, if it is detected that an action of looking up or looking down is ongoing for a predetermined amount of time or beyond, then the electrical outlet control unit 213 and the mode control unit can be configured to perform control in such a way that the PC is switched to the standby mode and the display device is switched OFF. Moreover, for an action of looking down, the electrical outlet control unit 213 can be configured to perform control in such a way that the desk lamp is not switched OFF.

In this way, in the present embodiment, the position of a person is detected to an accuracy of his or her shoulder width, and the direction and the posture of the person is detected prior to performing electrical power control of the devices. Hence, electrical power control of the devices can be performed to a more accurate level, and further electrical power saving and energy saving can be achieved while maintaining the comfort of the staff members as well as while enhancing the work efficiency.

That is, in the present embodiment, it is not only the detection of a person that is possible; but the devices possessed by that person, the lighting devices located directly above that person, the air-conditioning devices, and the office devises can also be controlled on an individual basis. Besides, at the same time, it is also possible to understand the electrical power usage of each and every person.

In the conventional technology, although it is possible to achieve what is called "visualization" of the electrical power of a building, an office, an entire factory, or an entire office; it is not clear about the way in which each individual person can save energy. Hence, unless the situation is pressing in which the total target value is exceeded or the supplied electrical energy is exceeded, it is difficult to be aware of electrical power saving and thus difficult to be able to continually promote electrical power saving. In contrast, according to the present embodiment, electrical power saving and energy saving can be achieved to a greater extent while maintaining the comfort of the staff members and while enhancing the work efficiency.

Moreover, according to the present embodiment, even regarding the automatic control of devices, performing collaborative control not only among the persons and the devices but also among the devices enables achieving further improvement in electrical power saving.

Given below is the explanation of an electrical power arbitration operation performed by the arbitration server device 800. During the electrical power arbitration operation, the electrical power to be allotted to each electrical device is calculated. The information about the calculated electrical power is, for example, sent from the arbitration server device 800 to the control server device 200. Then, instead of performing the device control operation explained with reference to FIGS. 13 and 15, the control server device 200 can control each electrical device to operate at the electrical power calculated for it.

Figure 16:
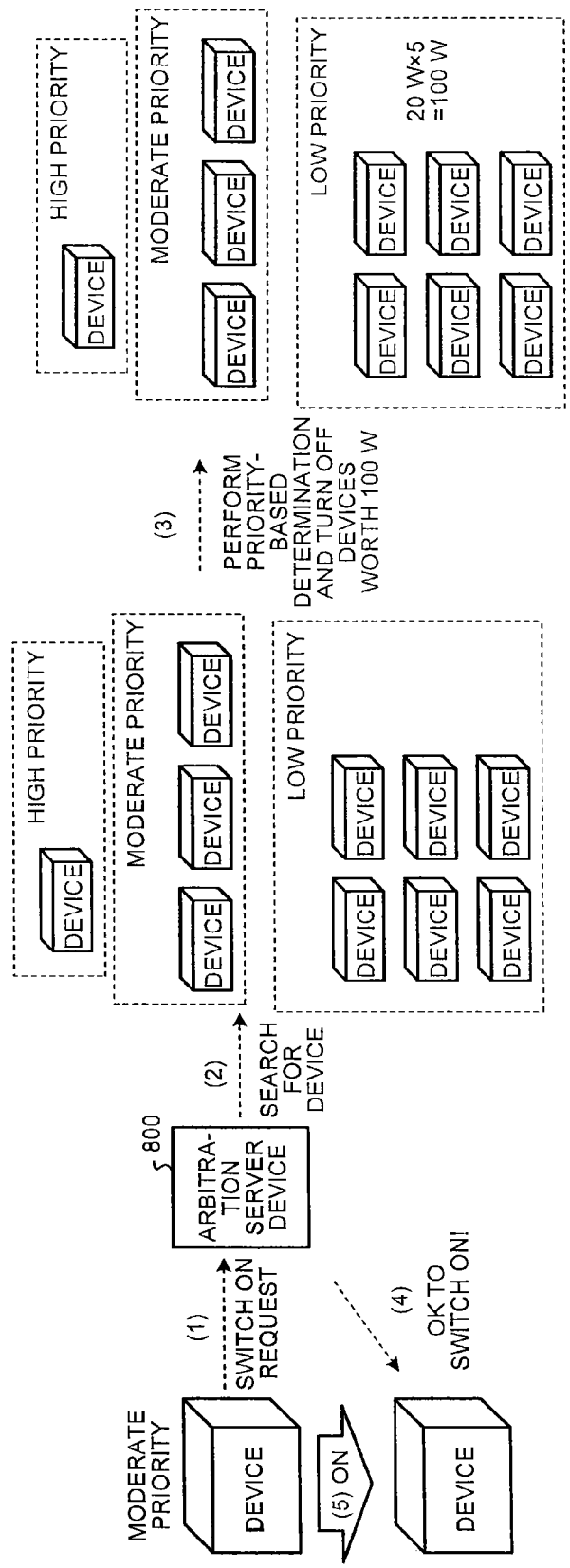
FIG. 16 is a diagram illustrating the general outline of an electrical power arbitration operation.
Figure 17:
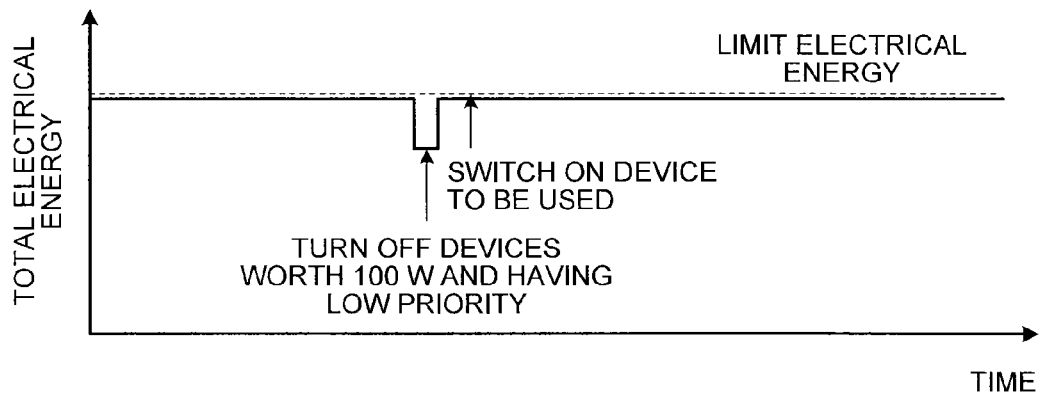
FIG. 17 is a diagram illustrating an example of changes occurring in the electrical energy with time.

Firstly, explained below with reference to FIGS. 16 and 17 is a general outline of the electrical power arbitration operation. FIG. 16 is a diagram illustrating the general outline of the electrical power arbitration operation. FIG. 17 is a diagram illustrating an example of changes occurring in the electrical energy with time.

As illustrated in (1) in FIG. 16, assume that a particular user issues a request to turn ON a particular device having the priority of "moderate" level. Meanwhile, in this example, it is assumed that the priority is set to three levels of "high", "moderate", and "low". Moreover, it is assumed that the device with respect to which the request to turn the power ON is issued has the power consumption of 100 watt (W). For example, when an action status indicating that a user is in the seated state in the seat at which the concerned device is installed is received from the positioning server device 100; the arbitration server device 800 can determine that a request to turn the power ON has been issued. Such a request for power supply control is temporarily stored in the arbitration server device 800.

Herein, the arbitration server device 800 can receive a request for power supply control from an arbitrary device. For example, the arbitration server device 800 can receive a request for power supply control from any of the smartphones 300, or from any of the LED lighting devices 500, or from any of the taps 600, or from any of the air-conditioning devices 700.

As illustrated in FIG. 17, consider a case in which, when the sum of the power consumption (the total electrical energy) of the electrical devices at the point of time of receiving a request is nearing a predetermined limit value (a limit electrical energy) and when an attempt is made to supply electrical power to a device having the power consumption of 100 W, it results in exceeding the limit electrical energy. In such a case, the arbitration server device 800 searches for another device having the priority of "low" level which is lower than the priority of "moderate" level (see (2) in FIG. 16). In FIG. 16, an example is illustrated in which a single device having the priority of "high" level is in operation, three devices having priority of "moderate" level are in operation, and six devices having the priority of "low" level are in operation.

With respect to the devices having low priority, the arbitration server device 800 stops supplying electrical power or reduces the supply of electrical power so as to reduce the total electrical energy worth 100 W (see (3) in FIG. 16). For example, as illustrated in the right-hand side in FIG. 16, the electrical power supplied to each of five devices having the priority of "low" level is reduced by 20 W, thereby saving electrical power worth 100 W. Then, the arbitration server device 800 determines to allow turning the power ON of the device with respect to which the request to turn the power ON was issued (see (4) in FIG. 16), and turns ON the power of that device (see (5) in FIG. 16).

In FIG. 17 is illustrated an example of changes occurring in the total electrical energy in the case when the electrical power arbitration operation illustrated in FIG. 16 is performed. Herein, after the total electrical energy is reduced by 100 W as illustrated in (3) in FIG. 16, electrical power is supplied to the device with respect to which the request to turn the power ON was issued. For that reason, the total electrical energy again increases close to the limit electrical energy. In this way, in the present embodiment, while ensuring that the limit electrical energy is not exceeded, the electrical power is supplied to the devices in descending order of priority to the extent possible. As a result, while avoiding the supply of electrical energy to the devices that do not require it, it becomes possible to efficiently supply the electrical power to the devices that are necessary in making the work environment comfortable.

Figure 18:
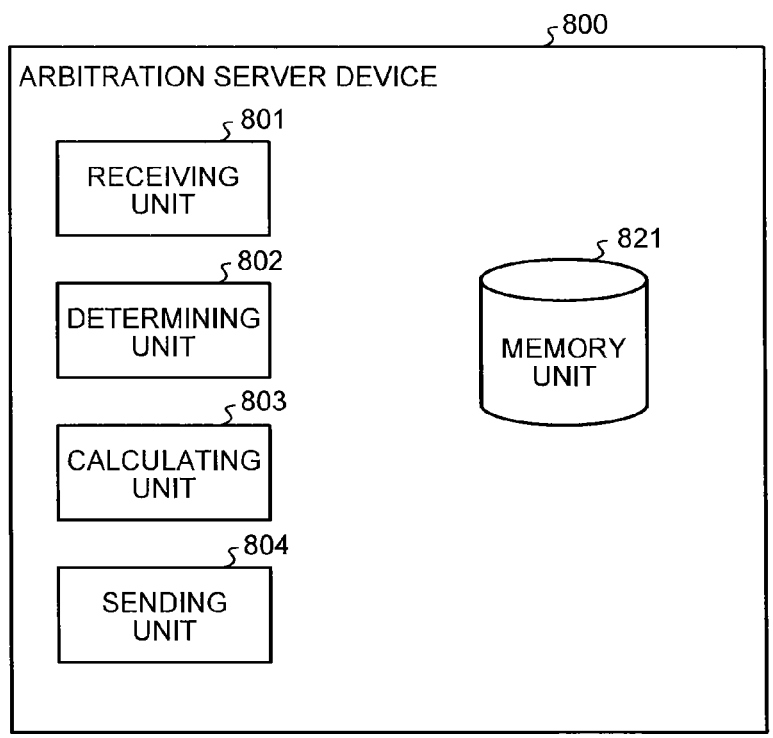
FIG. 18 is a block diagram illustrating a functional configuration of an arbitration server device.

FIG. 18 is a block diagram illustrating a functional configuration of the arbitration server device 800. As illustrated in FIG. 18, the arbitration server device 800 includes a receiving unit 801, a determining unit 802, a calculating unit 803, a sending unit 804, and a memory unit 821.

The memory unit 821 is used to store a variety of information that is referred to during the electrical power arbitration operation. For example, the memory unit 821 is used to store the information that is sent from the positioning server device 100 and that indicates the positions and the action statuses of users. Moreover, the memory unit 821 is used to store priority tables that are referred to by the determining unit 802 at the time of determining the priority.

Figure 19:
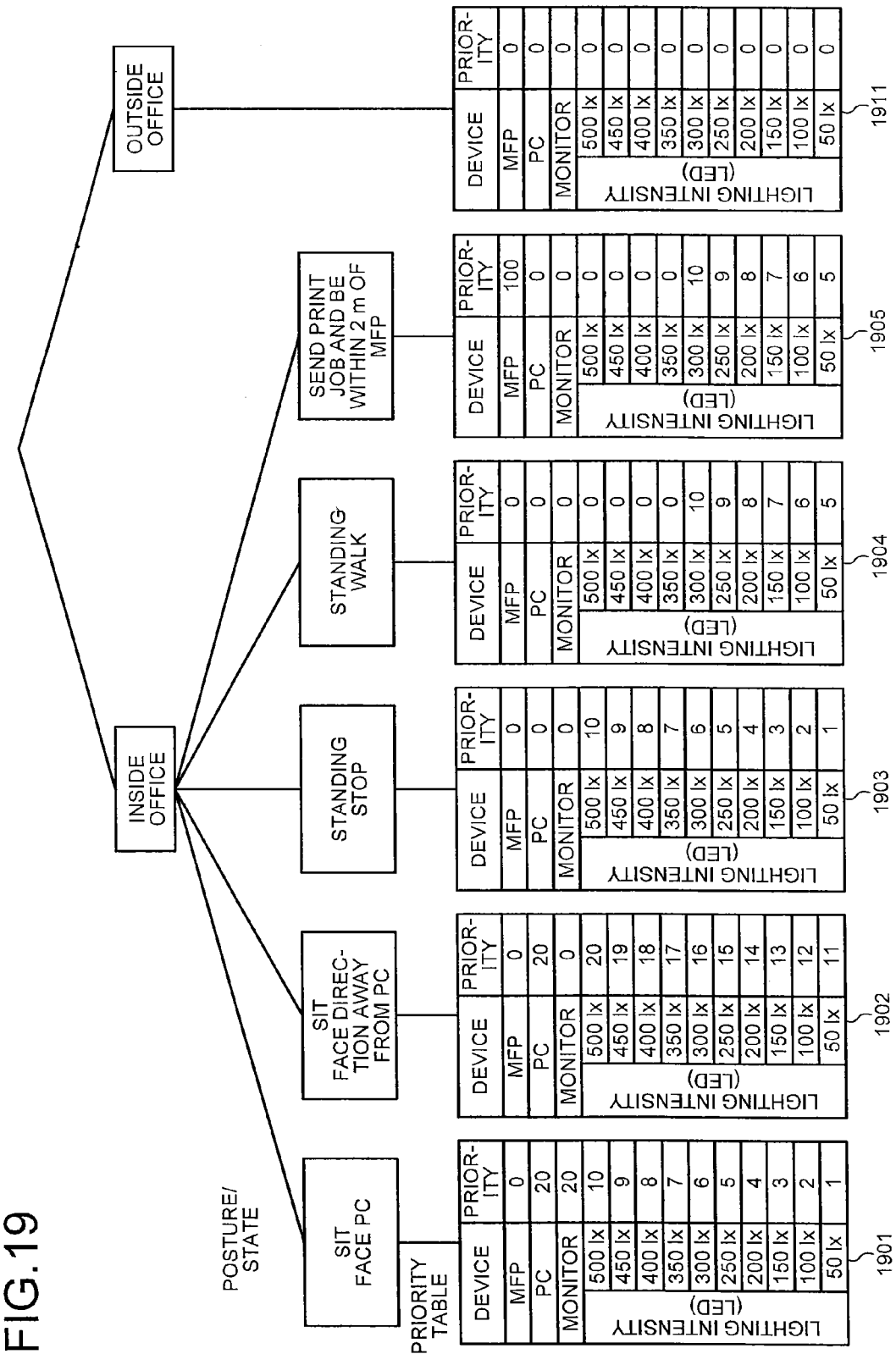
FIG. 19 is a diagram illustrating an exemplary data structure of priority tables.

FIG. 19 is a diagram illustrating an exemplary data structure of the priority tables. However, the data structure of the priority tables is not limited to the example illustrated in FIG. 19. Herein, in FIG. 19 is illustrated an example in which different priority tables are set depending on whether the position of a user is inside the office or outside the office and depending on the action status (such as seated, standing, or the like) of the user. A priority table 1911 is a priority table created for the case when the user is present outside the office. In contrast, priority tables 1901 to 1905 are priority tables created for the case when the user is present inside the office. Each priority table includes types of devices and respective priorities. As Examples of the devices; a multi-function peripheral (MFP), a PC, a monitor, and LED lighting devices are illustrated.

Besides, the configuration can be such that the priority is set depending on the operation mode of each device. In FIG. 19 is illustrated an example in which the lighting intensities of LED lighting devices are considered to be the operation modes, and the priority is set for each operation mode. However, the operation mode is not limited to lighting intensity. Alternatively, for example, the operation mode can point to whether the PC is in the standby mode or in the normal mode.

Meanwhile, the memory unit 821 can be configured with any type of commonly-used memory device such as an HDD, an optical disk, or a random access memory (RAM).

The receiving unit 801 receives a variety of information from external devices such as the positioning server device 100 and the control server device 200. For example, the receiving unit 801 receives information that is sent from the positioning server device 100 and that indicates the position and the action status of a user. Moreover, the receiving unit 801 receives a request for electrical power arbitration from, for example, the control server device 200.

The determining unit 802 determines the priority of each electrical device according to at least either the position of the user or the action status of the user. For example, the determining unit 802 extracts, from the memory unit 821, the priority table corresponding to the position and the action status of the user; refers to the extracted priority table; and determines the priority of each electrical device corresponding to the position and the action status of the user.

The determining unit 802 can perform the operation of determining the priority when, for example, a request for allotment of electrical power is received with respect to at least one of a plurality of electrical devices or when there is a change in at least either the position or the action status of a person.

Based on the priority that is determined, the calculating unit 803 calculates the electrical power to be allotted to each electrical device in such a way that the sum of electrical power allotted to the electrical devices (i.e., the total electrical energy) is within the limit electrical energy and that the devices having high priority are allotted with the electrical power on a priority basis. For example, the calculating unit 803 allots necessary electrical power to the electrical devices having the highest priority. If the total value of allotted electrical power is smaller than the limit electrical energy, then the calculating unit 803 allots electrical power to the electrical device having the next highest priority. The calculating unit 803 repeats these operations, and can calculate electrical power in such a way that the total electrical energy is equal to the maximum value not exceeding the limit electrical energy.

The sending unit 804 sends a variety of information to external devices such as the positioning server device 100 and the control server device 200. For example, the sending unit 804 sends, to the control server device 200, the information about the calculated electrical power to be allotted to each electrical device. Then, the control server device 200 refers to the information about the electrical power as sent from the arbitration server device 800 and accordingly performs control for supplying electrical power to each electrical device.

Figure 20:
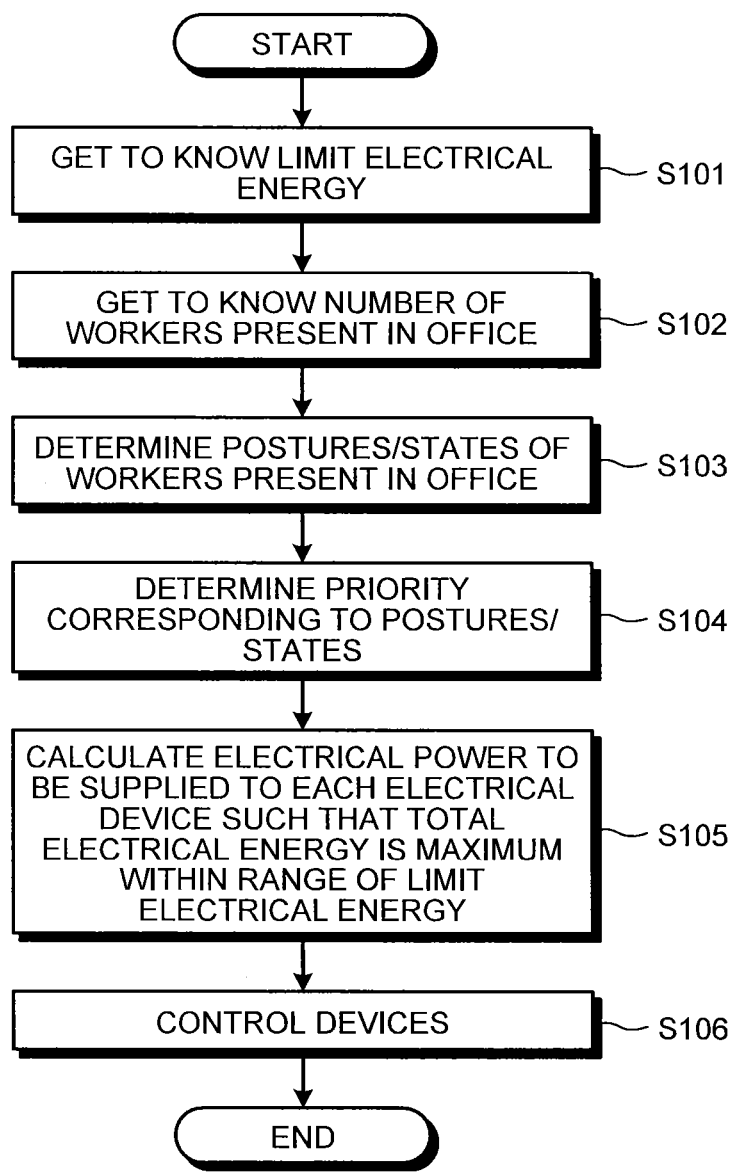
FIG. 20 is a flowchart for explaining a sequence of operations during the electrical power arbitration operation performed by the arbitration server device according to the present embodiment.

Given below is the explanation of an electrical power arbitration operation performed by the arbitration server device 800 that is configured in the abovementioned manner according to the present embodiment. FIG. 20 is a flowchart for explaining a sequence of operations during the electrical power arbitration operation performed by the arbitration server device 800 according to the present embodiment. The following explanation is given for an example in which an office is treated as the target area for control, and arbitration of the electrical power is done according to the positions and the action statuses of users (workers) present in the office.

The arbitration server device 800 gets to know the limit electrical energy (Step S101). For example, the arbitration server device 800 stores in advance the value of the limit electrical energy in the memory unit 821, and then refers to that value to get to know the value of the limit electrical energy.

Then, the arbitration server device 800 gets to know the number of workers in the office (Step S102). For example, the arbitration server device 800 gets to know the number of workers in the form of the number of sets of information about the positions of persons as sent from the positioning server device 100.

Subsequently, the arbitration server device 800 determines the positions and the action statuses (postures and states) of the workers present in the office (Step S103). In the present embodiment, since the positioning server device 100 sends the information about the positions and the action statuses of the persons, the arbitration server device 800 determines the postures and the states of the workers in the office according to the received information. In a configuration in which the functions of the positioning server device 100 and the functions of the arbitration server device 800 are integrated; for example, the position identifying unit 102 and the action status detecting unit 103 are disposed in the arbitration server device 800 for the purpose of determining the postures and the action statuses of the workers present in the office.

The determining unit 802 of the arbitration server device 800 determines the priority of each electrical device corresponding to the determined posture and the determined state of a worker (Step S104). For example, the determining unit 802 reads, from the memory unit 821, a priority table corresponding to the posture and the state of a worker. Then, the determining unit 802 refers to the priority table and determines the priority for each electrical device.

The calculating unit 803 refers to the determined priority, and calculates the electrical power to be supplied to each electrical device in such a way that the total electrical energy is equal to the maximum value not exceeding the limit electrical energy (Step S105). Then, the sending unit 804 sends, to the control server device 200, the calculated value of electrical power to be supplied to each electrical device.

The control server device 200 refers to the value of electrical power sent thereto, and controls the supply of electrical power in such a way that the electrical power supplied to the electrical devices is equal to the value of electrical power sent thereto (Step S106).

Figure 21:
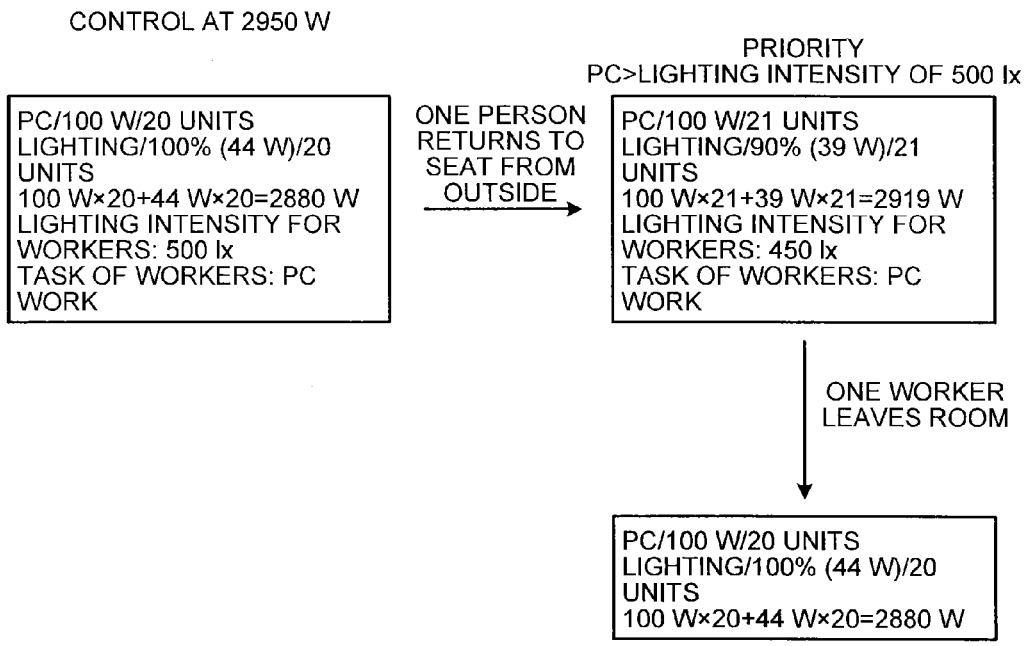
FIGS. 21 to 23 are diagrams for explaining specific examples of the electrical power arbitration operation.
Figure 22:
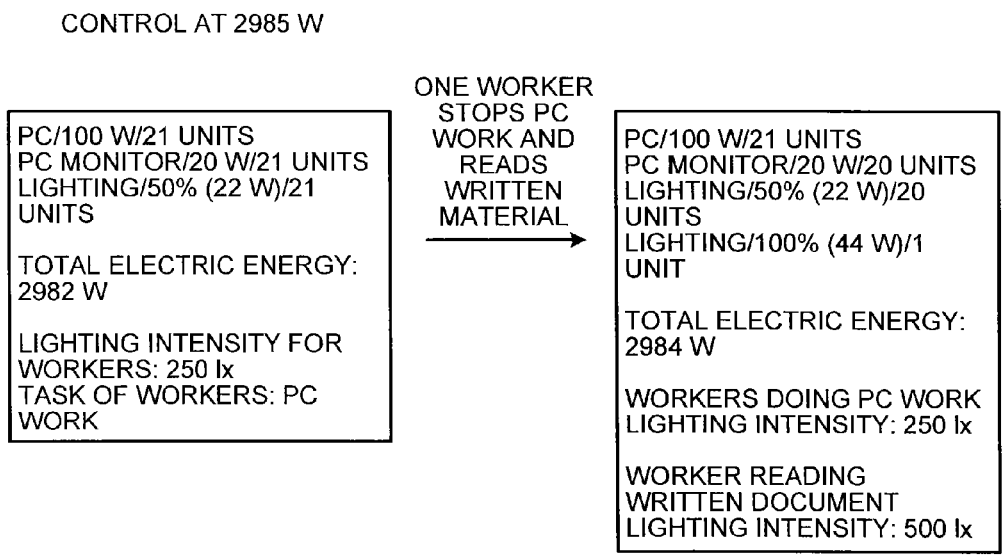
Figure 23:
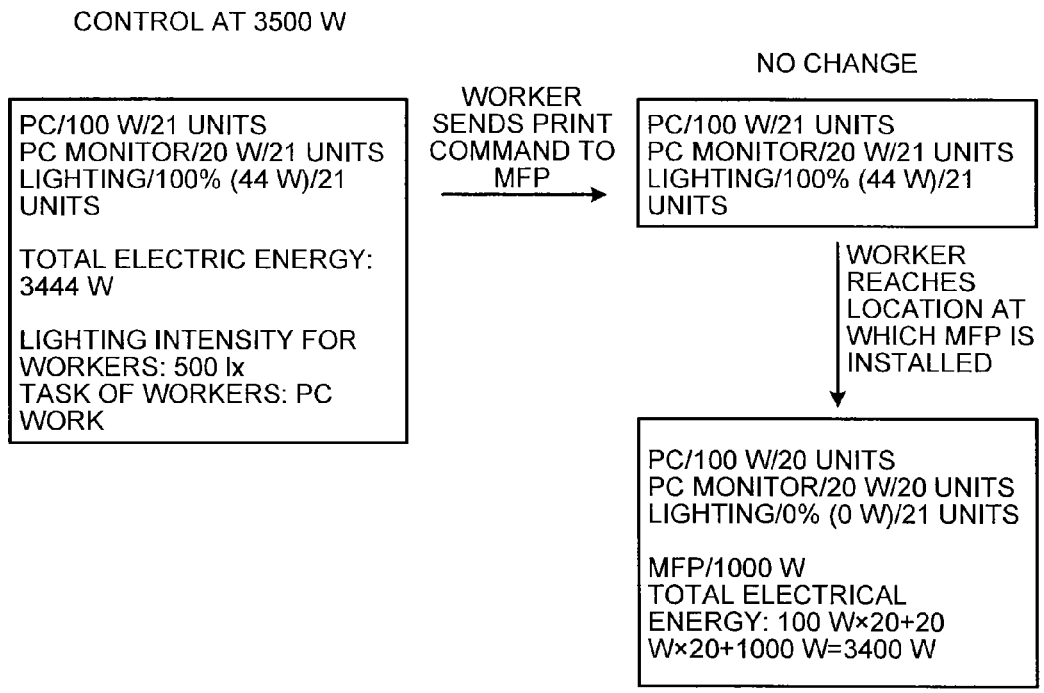

Explained below with reference to FIGS. 21 to 23 are specific examples of the electrical power arbitration operation. FIGS. 21 to 23 are diagrams for explaining specific examples of the electrical power arbitration operation.

In FIG. 21 is illustrated an example in which notebook PCs and LED lighting devices are used as the electrical devices. Moreover, in this example, position information of workers is used as the information indicating the positions and action statuses of the workers. Furthermore, it is assumed that the limit electrical energy is equal to 2950 W and the power consumption per notebook PC is 100 W. Moreover, it is assumed that the power consumption of an LED lighting device is 44 W at 100% lighting intensity (as an example, 500 lux (1×)).

The following explanation is given for an example in which 20 workers are originally present; one worker returns to the seat from outside; and one worker leaves the office. When 20 workers are present, the total electrical energy is 100 W×20+44 W×20=2880 W. In this case, for example, even if the necessary electrical power is allotted in descending order of priority specified in the priority table 1901 illustrated in FIG. 19, that is, in the order of PCs (having priority set to 20) and the lighting intensity of 500 1× (having priority set to 10); the total electrical energy does not exceed the limit electrical energy.

When one worker returns from outside and the total number of workers becomes 21; firstly, the electrical power is allotted to the PCs in descending order of priority. The power consumption of the PCs becomes equal to 100 W×21=2100 W. Subsequently, if the electrical power is to be allotted to the lighting intensity of 500 1× having the next highest priority (set to 10), then the required electrical power becomes equal to 44 W×21=924 W. In that case, the total electrical energy becomes equal to 2100+924=3024 W, which exceeds the limit electrical energy. Hence, when the electrical power is to be further allotted to the lighting intensity of 450 1× having the next highest priority (set to 9), the total electrical energy is compared with the limit electrical energy. In this case, the total electrical energy becomes equal to 2100+819(=39×21)=2919, which is smaller than the limit electrical energy. In this case, in the present embodiment, it can be ensured that the total electrical energy does not exceed the limit electrical energy; the devices having high priority are allotted with the electrical power on a priority basis; and the devices (such as the LED lighting devices) used to make the work environment comfortable are supplied with the electrical power in an appropriate manner.

After that, when one worker leaves the office, the lighting intensity of the LED lighting devices is increased to 100% (500 1×) in an identical manner to the original state.

In FIG. 22 is illustrated an example in which PCs, monitors, and LED lighting devices are used as the electrical devices. Moreover, in this example, postures of the workers (i.e., whether a worker is facing toward a PC while being seated or facing in another direction other than the direction of a PC while being seated) is used as the information indicating the positions and action statuses of the workers. Furthermore, it is assumed that the limit electrical energy is equal to 2985 W, and it is assumed that the power consumption per notebook PC is 100 W and the power consumption per monitor is 20 W. Moreover, it is assumed that the power consumption of an LED lighting device is 44 W at 100% lighting intensity (as an example, 500 lux (1×)).

The following explanation is given for an example in which 21 workers are originally present; each worker is doing work using a PC (i.e., doing PC work); and one worker stops doing PC work and starts reading written material. When 21 workers are present, the total electrical energy is 100 W×21+20 W×21+22 W (equivalent to 50% lighting intensity)×21=2982 W. In this case, the priority table 1901 illustrated in FIG. 19 is used that corresponds to the posture of facing the PC. In this example, according to the priority, the lighting intensity of 250 1× (priority 5) that does not result in exceeding the total electrical energy is determined as the lighting intensity of the LED lighting devices.

When one worker stops doing PC work and starts reading written material, the positioning server device 100 detects that the worker is facing some other direction other than the direction of the PC. Then, for example, treating the reception of that information as the trigger, the arbitration server device 800 determines the priority and calculates the electrical power supply amount. Moreover, with respect to the PC corresponding to the user who was detected to have faced some other direction other than the direction of the PC, the determining unit 802 applies, for example, the priority table 1902 illustrated in FIG. 19. With respect to the PCs of all other users, for example, the priority table 1901 illustrated in FIG. 19 is applied in an identical manner to the original state.

In the priority table 1902, the lighting intensity of 500 1× is set to have the priority of 20 and the monitors are set to have the priority of 0. Therefore, regarding the electrical power of the LED lighting device corresponding to the user who was detected to have faced some other direction other than the direction of the PC; 44 W that is equivalent to the lighting intensity of 500 1× is calculated. Moreover, regarding the electrical power of the monitor, "0" is calculated as the electrical power because the priority is set to 0.

In FIG. 23 is illustrated an example in which PCs, LED lighting devices, and an MFP are used as the electrical devices. Moreover, in this example, the positions of the workers (i.e., whether a worker is present at the position of the MFP) is used as the information indicating the positions and action statuses of the workers. Furthermore, it is assumed that the limit electrical energy is equal to 3500 W, and it is assumed that the power consumption per PC is 100 W and the power consumption per monitor is 20 W. Moreover, it is assumed that the power consumption of an LED lighting device is 44 W at 100% lighting intensity (as an example, 500 lux (1×)). Furthermore, it is assumed that the power consumption of the MFP is 1000 W.

The following explanation is given for an example in which 21 workers are originally present and one worker issues a print command to the MFP. When 21 workers are present, the total electrical energy is 100 W×21+20 W×21+44 W (equivalent to 100% lighting intensity)×21=3444 W. In this case, the priority table 1901 illustrated in FIG. 19 is used that corresponds to the posture of facing the PCs while seated.

Assume that one worker issues a print command to the MFP. At that point of time, since there is no change in the positions and the action statuses of the workers, the electrical power supply amount also does not change. Then, assume that the worker who issued the print command moves to the position at which the MFP is installed. In that case, with respect to the devices corresponding to the worker who issued the print command, the priority table 1905 illustrated in FIG. 19 is applied that corresponds to the action status of sending a print job and then moving within 2 m of the MFP.

In the priority table 1905, the MFP is set to have the priority of 100 and the PCs and monitors are set to have the priority of 0. For that reason, regarding the PC and the monitor corresponding to the worker who issued the print command, "0" is calculated as the electrical power. Moreover, in this example, since the MFP has large power consumption, "0" is calculated as the electrical power of all LED lighting devices too. Meanwhile, the configuration can be such that, instead of commonly controlling the electrical power of all LED lighting devices, electrical power control is performed on an individual basis. For example, in the example given above, the configuration can be such that the electrical power worth 3500 W-3400 W-100 W can be allotted to some of the LED lighting devices.

In this way, the arbitration device according to the present embodiment sets an order of priority to the devices according to at least either the positions of users or the action statuses of users. Then, the arbitration device allots the electrical power to each electrical device in such a way that priority is given to the electrical devices having a higher order of priority and that the total amount of electrical power to be allotted to the electrical devices is within a limit value. As a result, it becomes possible to efficiently control the electrical power supply to the devices.

Thus, in the arbitration device according to the present embodiment, the prioritization with respect to the devices is dynamically done in accordance with the behavior and the state of the users. Hence, for example, even if a plurality of staff members working in an office performs actions at individual time slots, the electrical power being used at unnecessary places is assessed and is instead supplied to the necessary places. With that, it becomes possible to provide a more comfortable work environment and to achieve an office space having high productivity. For example, in the case when the user of a PC leaves the seat while keeping the PC power ON, it can be determined from the behavior (position information) and the state (action status) of the user that he or she has gone away from the PC. Then, the electrical power supply to that PC can be controlled by lowering the corresponding priority, and the surplus electrical power can be supplied to other devices. As a result, it becomes possible to efficiently control the electrical power supply to the devices.

Figure 24:
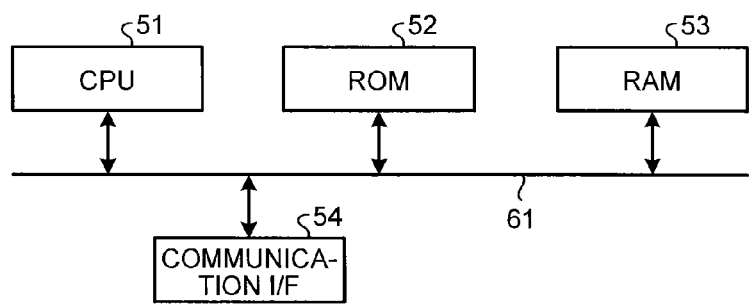
FIG. 24 is an explanatory diagram illustrating an exemplary hardware configuration of the devices according to the embodiment.

Explained below with reference to FIG. 24 is a hardware configuration of the devices (the positioning device 100, the control server device 200, and the arbitration server device 800) according to the present embodiment. FIG. 24 is an explanatory diagram illustrating an exemplary hardware configuration of the devices according to the embodiment.

Each device according to the present embodiment has a hardware configuration of a general-purpose computer that includes a control device such as a central processing unit (CPU) 51, a memory device such as a read only memory (ROM) 52 and a random access memory (RAM) 53, a communication I/F 54 that performs communication by establishing connection with a network, an external memory device such as an HDD or a CD drive device, a display device, an input device such as a keyboard or a mouse, and a bus 61 that connects the other constituent elements to each other.

Meanwhile, the computer programs executed in the present embodiment are recorded in the form of installable or executable files on a computer-readable recording medium such as a compact disk read only memory (CD-ROM), a flexible disk (FD), a compact disk recordable (CD-R), or a digital versatile disk (DVD), and can be provided as a computer program product.

Alternatively, the computer programs executed in the present embodiment can be saved in a downloadable manner on a computer connected to the Internet. Still alternatively, the computer programs executed in the present embodiment can be distributed over a network such as the Internet.

Still alternatively, the computer programs executed in the present embodiment can be stored in advance in a ROM or the like.

A computer program executed in the arbitration server device 800 according to the present embodiment contains modules for each of the abovementioned constituent elements (the receiving unit, the determining unit, the calculating unit, and the sending unit). In practice, for example, a CPU (processor) reads the computer program from the recording medium mentioned above and runs it so that the computer program is loaded in a main memory device. As a result, the module for each of the abovementioned constituent elements is generated in the main memory device. Meanwhile, some of all of the abovementioned constituent elements can be implemented using hardware circuitry too.

First Modification Example

The configuration can be such that, out of the device control performed according to the embodiment, electrical power control with respect to display devices is not performed according to the direction of a person.

Second Modification Example

The configuration can be such that, out of the device control performed according to the embodiment, electrical power control with respect to display devices is not performed according to the direction of a person and electrical power control with respect to desktop PC main bodies or display devices is not performed in conjunction with the personal recognition information.

Third Modification Example

The configuration can be such that, regarding the device control performed according to the present embodiment, apart from detecting the standing state and the seated state, a posture having a correlation between the standing state and the seated state is also detected and the electrical power control with respect to the display devices is performed based on that posture.

Fourth Modification Example

The method by which the determining unit 802 determines the priority is not limited to the method based on the priority tables illustrated in FIG. 19. Alternatively, for example, the configuration can be such that whether or not an electrical device is in operation is determined and the priority is kept variable depending on the determination result. For example, in the case of a PC, the operating state of the PC is determined from the CPU usage and the memory variation, and high priority can be set when the operating state is such that the electrical power supply to the PC cannot be stopped.

Fifth Modification Example

As far as the technology capable of detecting the position of a person is concerned, apart from the method by which the positioning server device 100 performs detection based on the detection data obtained from the acceleration sensor, the angular velocity sensor, and the geomagnetic sensor; the following technologies are known for example: room entry-exit management using IC cards; detection of a person using a human sensor; using a wireless LAN; using an indoor GPS (IMES: Indoor MEssaging System); by performing image processing of captured images of a camera; using an active radio-frequency identification device (RFID); and using visible light communication.

As far as the room entry-exit management using IC cards is concerned, although it is possible to perform individual identification, the positioning accuracy covers the entire target area for management and is thus extremely low. For that reason, although it becomes possible to know who is present in that area, it is not possible to understand the activity statuses of the persons present in that area.

As far as detection of a person using a human sensor is concerned, although it is possible to achieve the positioning accuracy of about 1 to 2 m that is the detection range of the human sensor, it is not possible to perform individual identification. Moreover, in order to understand the activity statuses of the persons present in that area, it becomes necessary to arrange a number of human sensors in a dispersed manner within the area.

As far as using a wireless LAN is concerned, distances are measured between a single wireless LAN terminal possessed by each person and a plurality of LAN access points set within the area, and the positions of the persons present in the area are identified using the principle of triangulation. In this method, although it is possible to perform individual identification, the positioning accuracy has a high environmental dependency. Hence, generally, the positioning accuracy is comparatively low at about 3 m or more.

As far as using an indoor GPS is concerned, a dedicated transmitter that emits electrical waves in the same frequency band as that of a GPS satellite is installed, and signals having position information embedded in the portion of timing information sent by a normal GPS satellite are transmitted from the transmitter. Then, those signals are received by a receiving terminal possessed by each person present in the room. That makes it possible to identify the positions of the persons present in the room. In this method, although it is possible to perform individual identification, the positioning accuracy is comparatively low at about 3 to 5 m. Besides, it is necessary to install a dedicated transmitter, thereby leading to an increase in the installation cost.

As far as performing image processing of captured images of a camera is concerned, it becomes possible to achieve a comparatively high positioning accuracy of about several tens of centim. However, it is difficult to perform individual identification. For that reason, in the positioning server device 100 according to the present embodiment, the captured images taken by the monitoring cameras 400 are used only in the case of correcting the absolute position, the direction, and the posture of a staff member.

As far as using an active RFID is used, each person possesses an RFID tag with a built-in electrical battery. Then, the information of each RFID tag is read using a tag reader so as to identify the position of the person. In this method, although it is possible to perform individual identification, the positioning accuracy has a high environmental dependency. Hence, generally, the positioning accuracy is comparatively low at about 3 m or more.

As far as using visible light communication is concerned, not only it is possible to perform individual identification, but it is also possible to obtain a comparatively high positioning accuracy of about several tens of centim. However, at a place where visible light is blocked, it is not possible to detect the persons. Besides, since there are many noise sources or interference sources such as the natural light and other visible light, it is difficult to maintain the stability of the detection accuracy.

In light of such technologies, in the method implemented by the positioning server device 100 according to the present embodiment, it becomes possible not only to perform individual identification but also to achieve the positioning accuracy equivalent to the shoulder width or the stride length of a person. Besides, the position as well as the action status of the person can also be detected. More particularly, in the method implemented by the positioning server device 100 according to the present embodiment, it becomes possible to detect the daily postures and actions of a staff member present in an office. That is, it becomes possible to detect walking (standing state), standing up (stationary state), sitting in a chair, crouching during work, changing the orientation (direction) while in the seated state or the standing state, looking toward the ceiling while in the seated state or the standing state, or looking down while in the seated state or the standing state.

Thus, in the present embodiment, based on the detection data obtained from the acceleration sensor, the angular velocity sensor, and the geomagnetic sensor of each smartphone 300 or each sensor group 301; the positioning server device 100 detects the absolute position and the action status of each staff member present in an office that is treated as the target area for control. However, the method of detecting the absolute position and the action status of a staff member in an office, which is treated as the target area for control, is not limited to the abovementioned method implemented by the positioning server device 100. Alternatively, for example, the absolute position and the action status of a staff member can be detected by implementing any one of the other methods mentioned above or a combination of those other methods. Still alternatively, any one of the other methods mentioned above or a combination of those other methods can be combined with the method implemented by the positioning server device 100, and the absolute position and the action status of a staff member can be detected.

Thus, according to an aspect of the present invention, it becomes possible to efficiently control the electrical power supply to devices.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An arbitration device comprising:
   circuitry configured to
   determine priority of each of a plurality of electrical devices according to a parameter including at least an action status of a person present in a target area for control, the target area having at least one person when the circuitry determines the priority, the action status of a person being determined by using at least one of an acceleration sensor, an angular velocity sensor, and a geomagnetic sensor, and
   calculate electrical power to be allotted to each of the electrical devices in such a way that a total of electrical power allotted to the electrical devices is within a limit value and the electrical devices having the priority at high levels are allotted with electrical power on a priority basis.

2. The arbitration device according to claim 1, wherein the circuitry calculates electrical power to be allotted to each of the electrical devices in such a way that a total of electrical power allotted to the electrical devices is equal to a maximum value not exceeding a limit value and the electrical devices having the priority at high levels are allotted with electrical power on a priority basis.

3. The arbitration device according to claim 1, wherein the circuitry determines, for each type of the electrical devices, the priority according to a parameter including at least an action status of a person.

4. The arbitration device according to claim 1, wherein the circuitry determines, for each operation mode of the electrical devices, the priority according to a parameter including at least an action status of a person.

5. The arbitration device according to claim 1, wherein when a request is issued for allotting electrical power to at least one of the electrical devices, the circuitry determines the priority according to a parameter including at least an action status of a person.

6. The arbitration device according to claim 1, wherein when there is a change in at least an action status of a person, the circuitry determines the priority according to at least a post-change action status of the person.

* * * * *